US012665614B2

(12) United States Patent
    Pulikkoonattu et al.

(10) Patent No.: US 12,665,614 B2
(45) Date of Patent: Jun. 23, 2026

(54) SYSTEM AND METHOD FOR LOW DENSITY PARITY CHECK (LDPC) CODE WITH 5/6 CODE RATE

(71) Applicant: Avago Technologies International Sales Pte. Limited, Singapore (SG)

(72) Inventors: Rethnakaran Pulikkoonattu, San Diego, CA (US); Andrew Blanksby, Irvine, CA (US); Vinko Erceg, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 42 days.

(21) Appl. No.: 18/647,699

(22) Filed: Apr. 26, 2024

(65) Prior Publication Data

US 2025/0047305 A1      Feb. 6, 2025

Related U.S. Application Data

(60) Provisional application No. 63/516,700, filed on Jul. 31, 2023, provisional application No. 63/516,688, filed on Jul. 31, 2023, provisional application No. 63/600,331, filed on Nov. 17, 2023, provisional application No. 63/600,327, filed on Nov. 17, 2023.

(51) Int. Cl.
    *H03M 13/11*          (2006.01)
(52) U.S. Cl.
    CPC ........ *H03M 13/116* (2013.01); *H03M 13/118* (2013.01)

(58) Field of Classification Search
    CPC ............. H03M 13/116; H03M 13/118; H03M 13/1188; H03M 13/036; H04L 1/0041; H04L 1/0045; H04L 1/0057
    See application file for complete search history.

(56) References Cited

U.S. PATENT DOCUMENTS

| | | | |
|---|---|---|---|
| 10,972,134 B2 * | 4/2021 | Strobel ............. | H03M 13/2906 |
| 2008/0022191 A1 * | 1/2008 | Stolpman ............ | H03M 13/353 |
| | | | 714/776 |

(Continued)

FOREIGN PATENT DOCUMENTS

| | | |
|---|---|---|
| EP | 3 540 948 A1 | 9/2019 |
| EP | 3 582 398 B1 | 6/2022 |

OTHER PUBLICATIONS

Mahdi et al., On the Encoding Complexity of Quasi-Cyclic LDPC Codes, Nov. 15, 2015, IEEE, vol. 63, No. 22, pp. 6096-6108. (Year: 2015).

(Continued)

*Primary Examiner* — Steve N Nguyen
(74) *Attorney, Agent, or Firm* — Foley & Lardner LLP

(57) ABSTRACT

In some implementations, an apparatus may include a transmitter and one or more processors. The one or more processors may be configured to identify, according to a code rate of 5/6 and a code block size of 3888 bits, a first binary parity check matrix for a quasi-cyclic-low-density parity-check (QC-LDPC) code. The first binary parity check matrix may correspond to a first exponent matrix having 96 values. The one or more processors may be configured to encode data using the first binary parity check matrix. The one or more processors may be configured to transmit the encoded data.

20 Claims, 15 Drawing Sheets

100

(56) References Cited

U.S. PATENT DOCUMENTS

| | | | |
|---|---|---|---|
| 2013/0311846 A1* | 11/2013 | Li | H03M 13/116 |
| | | | 714/752 |
| 2014/0157079 A1 | 6/2014 | Park et al. | |
| 2016/0211941 A1* | 7/2016 | Shen | H04L 1/0041 |
| 2016/0380722 A1* | 12/2016 | Hassanin | H04L 1/0045 |
| | | | 714/776 |
| 2017/0149528 A1* | 5/2017 | Kim | H03M 13/05 |
| 2017/0187489 A1 | 6/2017 | Myung et al. | |
| 2018/0287632 A1* | 10/2018 | Rom | G06F 3/0655 |
| 2019/0334652 A1 | 10/2019 | Myung et al. | |
| 2021/0211143 A1* | 7/2021 | Richardson | H03M 13/036 |
| 2022/0077874 A1 | 3/2022 | Myung et al. | |
| 2022/0294474 A1* | 9/2022 | Motwani | H03M 13/353 |
| 2023/0253984 A1 | 8/2023 | Jang et al. | |
| 2024/0120949 A1 | 4/2024 | Morero et al. | |
| 2025/0047308 A1 | 2/2025 | Pulikkoonattu et al. | |

OTHER PUBLICATIONS

Non-Final Office Action on U.S. Appl. No. 18/647,710 DTD Jun. 5, 2025.

Non-Final Office Action on U.S. Appl. No. 18/647,738 DTD Jun. 18, 2025.

European Office Action on European Patent Appln. No. 24190405.1 dated Aug. 28, 2025.

European Office Action on European Patent Appln. No. 24191478.7 dated Aug. 28, 2025.

European Office Action on European Patent Appln. No. 24191490.2 dated Aug. 28, 2025.

H. Wu and H. Wang, "A High Throughput Implementation of QC-LDPC Codes for 5G NR," in IEEE Access, vol. 7, pp. 185373-185384, 2019, (Year: 2019).

Non-Final Office Action on U.S. Appl. No. 18/647,759 DTD Dec. 18, 2025.

* cited by examiner

100
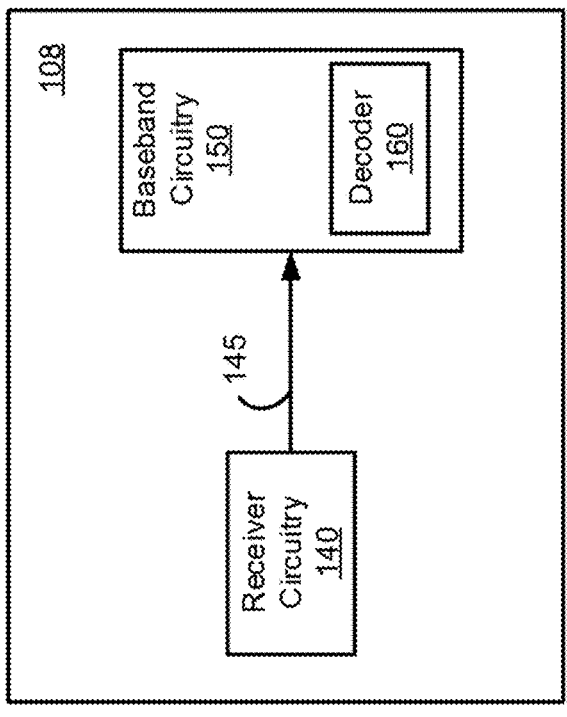
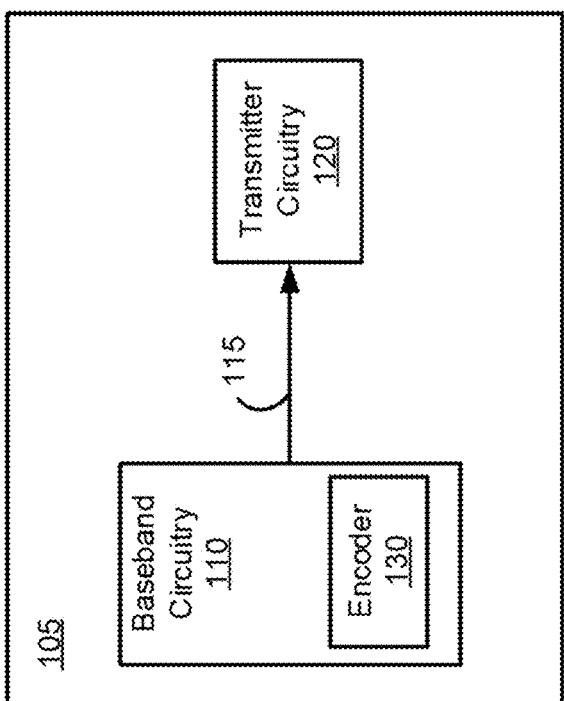
FIG. 1

700

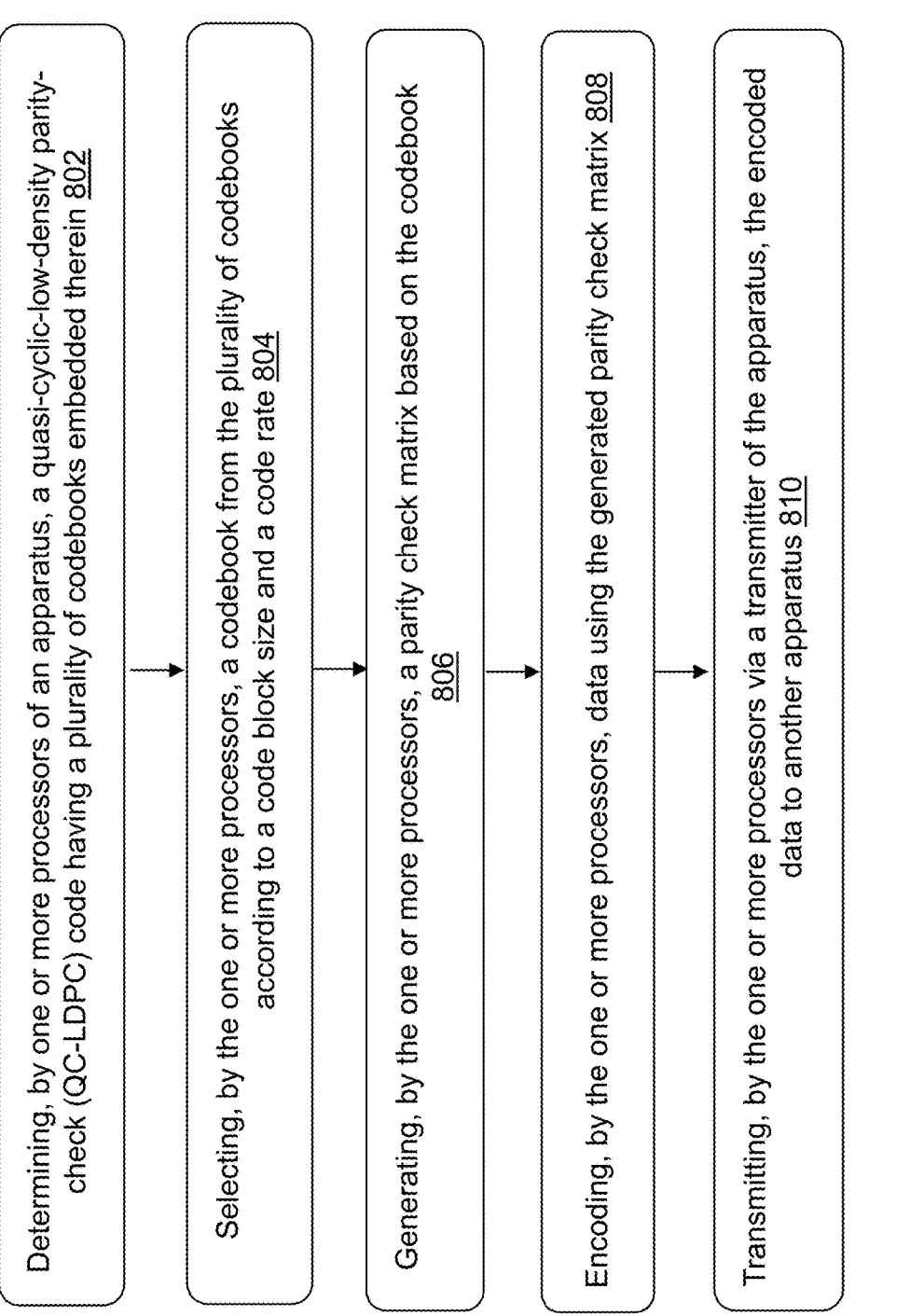

800

Determining, by one or more processors of an apparatus, a quasi-cyclic-low-density parity-check (QC-LDPC) code having a plurality of codebooks embedded therein 802

Selecting, by the one or more processors, a codebook from the plurality of codebooks according to a code block size and a code rate 804

Generating, by the one or more processors, a parity check matrix based on the codebook 806

Encoding, by the one or more processors, data using the generated parity check matrix 808

Transmitting, by the one or more processors via a transmitter of the apparatus, the encoded data to another apparatus 810

FIG. 8

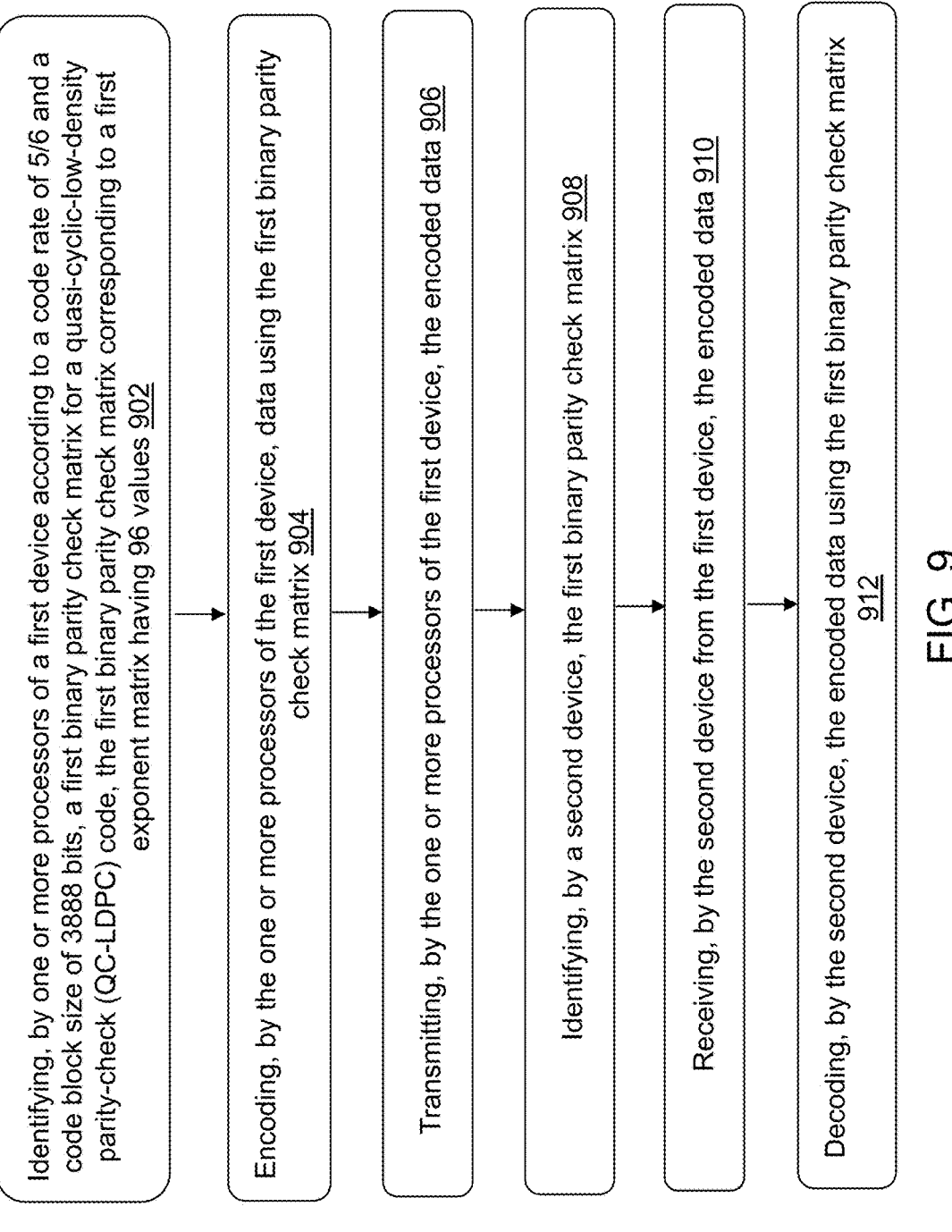

900

Identifying, by one or more processors of a first device according to a code rate of 5/6 and a code block size of 3888 bits, a first binary parity check matrix for a quasi-cyclic-low-density parity-check (QC-LDPC) code, the first binary parity check matrix corresponding to a first exponent matrix having 96 values 902

Encoding, by the one or more processors of the first device, data using the first binary parity check matrix 904

Transmitting, by the one or more processors of the first device, the encoded data 906

Identifying, by a second device, the first binary parity check matrix 908

Receiving, by the second device from the first device, the encoded data 910

Decoding, by the second device, the encoded data using the first binary parity check matrix 912

FIG. 9

SYSTEM AND METHOD FOR LOW DENSITY PARITY CHECK (LDPC) CODE WITH 5/6 CODE RATE

CROSS-REFERENCE TO RELATED APPLICATIONS

This application claims the benefit of priority to each of U.S. Provisional Patent Application No. 63/516,688 filed on Jul. 31, 2023, U.S. Provisional Patent Application No. 63/516,700 filed on Jul. 31, 2023, U.S. Provisional Patent Application No. 63/600,327 filed on Nov. 17, 2023, and U.S. Provisional Patent Application No. 63/600,331 filed on Nov. 17, 2023, all of which are incorporated herein by reference in their entirety for all purposes.

FIELD OF THE DISCLOSURE

This disclosure generally relates to systems and methods for improving an encoding process and/or a decoding process of a communications system using a quasi-cyclic-low-density parity-check (QC-LDPC) code.

BACKGROUND

Error correcting codes enable information data to be exchanged between a transmitter communication system and a receiver communication system in a reliable manner. A transmitter communication system encodes the information data to obtain a codeword. The codeword is encoded information data. The transmitter communication system transmits the codeword to the receiver communication system. Due to noise in the communication channel, the transmission received by the receiver communication system may not be identical to the transmitted codeword. Encoding information data allows a receiver communication system with a proper decoding process to recover the information data from the received transmission despite such noise. For example, the transmitter communication system transmits parity bits to the receiver communication system. The parity bits allow the receiver communication system to verify whether the received transmission is a valid codeword and to correct errors in the transmission if the received transmission is not a valid codeword. In one approach, generating parity bits involves a complex process.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 1 is a diagram depicting an example communication environment with communication systems, according to one or more embodiments.

FIG. 8 is a flow diagram showing a process for encoding data using an LDPC code, in accordance with an embodiment.

FIG. 9 is a flow diagram showing a process for encoding data and/or decoding data using an LDPC code, in accordance with an embodiment.

Figure 2:
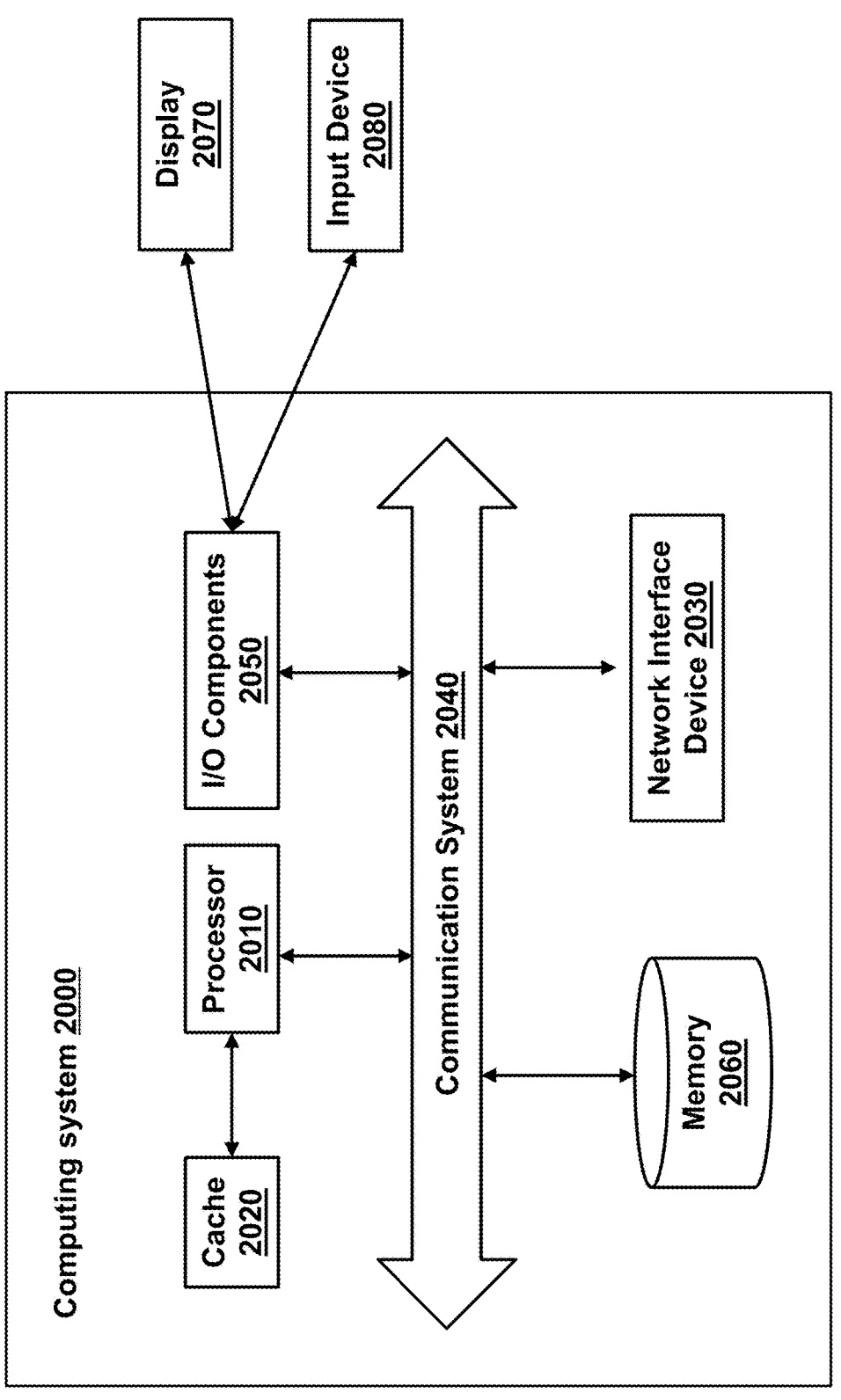
FIG. 2 is a schematic block diagram of a computing system, according to an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, a first feature in communication with or communicatively coupled to a second feature in the description that follows may include embodiments in which the first feature is in direct communication with or directly coupled to the second feature and may also include embodiments in which additional features may intervene between the first and second features, such that the first feature is in indirect communication with or indirectly coupled to the second feature. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to an apparatus including a transmitter and one or more processors. The one or more processors may be configured to determine a quasi-cyclic-low-density parity-check (QC-LDPC) code having a plurality of codebooks embedded therein. The one or more processors may be configured to select a codebook from the plurality of codebooks according to a code block size and a code rate. The one or more processors may be configured to generate a parity check matrix based on the codebook. A parity check matrix refers to a matrix that can define relationships (e.g., parity-check equations or constraints) between information bits and parity bits. A binary parity check matrix refers to a parity check matrix in which all the entries are either 0 or 1. The one or more processors may be configured to encode data using the generated parity check matrix. The one or more processors may be configured to transmit, via the transmitter, the encoded data to another apparatus.

In some implementations, each codebook of the plurality of codebooks may include a plurality of integers, the number of the plurality of integers being equal to the number of elements of the parity check matrix divided by z, where z is an integer representing a lifting size of the QC-LDPC code.

In some implementations, each codebook of the plurality of codebooks may represent an exponent matrix of the parity check matrix. In some implementations, each element of the exponent matrix may correspond to a cyclic shift value of an identity matrix. A size of the identity matrix is z×z, and the cyclic shift value d is an integer such that −1≤d<z, where Z is an integer representing a lifting size of the QC-LDPC code. The cyclic shift value d may represent a shifted identity matrix that is obtained by right-shifting the identity matrix by d. The cyclic shift value −1 may represent a null matrix of the identity matrix.

In some implementations, in generating the parity check matrix based on the selected codebook, the one or more processors may be configured to generate an exponent matrix based on the selected codebook. For each element of the exponent matrix, the one or more processors may be configured to generate a shifted identity matrix of an identity matrix based on a value of each element of the exponent matrix. The one or more processors may be configured to generate the parity check matrix such that the parity check matrix includes, as an element corresponding to each element of the exponent matrix, the generated shifted identity matrix.

In some implementations, the code block size may be 3888 bits, and the code rate may be 5/6. The code block size (denoted by n) refers to a total number of coded or transmitted bits as a result of encoding data using an error correction code (e.g., LDPC). The number of information bits (denoted by k) refers to a number of bits that carry the data to be subject to the encoding using the error correction code. The code rate (denoted by R) refers to a ratio of the number of information bits to the code block size (R=k/n). The plurality of codebooks may include a first codebook and a second codebook. The first codebook may include [28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0]. The second codebook may include [27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −19 −1 146 105 2 −1 −1 0].

In one aspect, a parity check matrix defines a set of equations that are satisfied by any valid codeword. The parity check matrix may be used for encoding low density parity check ("LDPC") codes, described by Richardson and Urbanke in IEEE Transactions on Information Theory, Vol. 47, No. 2 (February 2001). Generally, many wireless and wireline communication systems use LDPC as a forward error correction coding scheme. However, the longest block length (in bit) for coded data, supported in the 802.11 standards (e.g., 802.11n-802.11 be) is 1944. There may be a limited gain in a radio channel (e.g., 2×2 multiple-input and multiple-output channels) that can be achieved using the block length of 1944.

To solve this problem, according to certain aspects, embodiments in the present disclosure relate to a technique to support or provide an LDPC code with the block length of 3888 and the code rate of 5/6. The block length of 3888 is 2 times that of the longest code supported in 802.11n-802.11be standards (e.g., the block length of 1944). In some implementations, the LDPC code has a quasi-cyclic (QC) structure which helps in efficient encoding and decoding. In some implementations, QC-LDPC codes may be a class of structured LDPC codes, which may be used in many practical applications including the IEEE 802.11n, 802.11ac, 802.11ax, 802.11be standards. In QC-LDPC codes, a parity check matrix has a cyclic structure that repeats itself in a quasi-cyclic manner, which can simplify the encoding and decoding processes, making QC-LDPC codes more efficient.

In some implementations, an LDPC encoder may take a block of k bits of information bits and produce n coded bits (with the code rate R=k/n). An LDPC decoder may operate on (noisy version of) n received bits and (ideally) recover the k information bits. In some implementations, the LDPC encoder may take a block of 3240 bits of information bits (k=3240) as input, encode the block of 3240 bits to produce a block of 3888 coded bits (n=3888) with the code rate 5/6 (R=k/n).

Generally, a parity check matrix for a code represents equations that determine whether errors have occurred during transmission. More formally, for all valid codewords (i.e., bits produced by the encoder with no errors), the following equation can be true:

$$Hc = 0 \qquad \text{(Equation 1)}$$

In Equation 1, "H" is the parity check matrix, "c" is a codeword vector, and "0" is a vector of all zeroes. The parity check matrix, H, is one way of describing a code.

A generator matrix for a code, G, satisfies the following equation:

$$sG = c \qquad \text{(Equation 2)}$$

In Equation 2, "s" is a vector of information bits, "G" is a generator matrix and "c" is the codeword that corresponds to "s." In some embodiments, a system (e.g., a communication system 108 including a decoder 160) can decode the codeword c to obtain the decoded data s using Equation 2.

The parity check and generator matrices for a code are related per the above matrix equations. Generally, if a parity check matrix is low density, the corresponding generator matrix will be high density, and vice versa. LCPC codes are accordingly characterized by low density parity check matrices and high density generator matrices. The density of a matrix relates to the number of operations that must be performed to implement one of the above equations. Although it was recognized by 1995 that LDPC codes could be used to transmit data with very few errors, i.e., with error rates as good or better than turbo codes, one disadvantage of LDPC codes is that their generator matrices were high density and that made encoding computationally intensive, rending the codes impractical for many applications.

In some implementations, a parity check matrix may have a quasi-cyclic structure, for example, a parity check matrix for QC-LDPC code (n=3888, k=3240, R=5/6). Given a lifting size Z, the parity check matrix may have a plurality of sub-matrices such that each submatrix is cyclically shifted version of an identity matrix of size (Z×Z), where Z=162, for example. A parity check matrix can be represented in two equivalent forms: (1) parity check matrix H and (2) a block matrix or an exponent matrix P=E(H).

In some implementations, a parity check matrix H may be a binary matrix whose size is m×n (each of m and n is an integer). Elements of the parity check matrix are binary values. Given a block length n and a code rate R, an LDPC code (or QC-LDPC code) LDPC (n, R) satisfies the following equations:

$$k = nR \qquad \text{(Equation 3)}$$

$$m = n(1 - R) \qquad \text{(Equation 4)}$$

In some implementations, a block matrix or an exponent matrix (QC-LDPC exponent matrix) may be obtained. Given a lifting size Z, the exponent matrix P=E(H) may have a size of m/Z×n/Z. If n=24Z (e.g., n=3888, Z=162), then the size of P=E(H) is 24(1−R)×24 (=n(1−R)/Z×n/Z). Elements of the exponent matrix may be integer values which correspond to cyclic shift values of identity matrix of size Z×Z. A parity check matrix H may be a sparse binary matrix that can be derived from an exponent matrix P=E(H). The generator matrix G may have a size n×k in binary form (e.g., elements of the generator matrix G are binary values). The exponent matrix P=E(H) may have a structure including a plurality of sub-matrices (e.g., A, B, C, D, E, T).

In some implementations, a binary QC-LDPC code LDPC (n, R) may be characterized by the null space of an n(1−R)×n parity check matrix H. The parity check matrix H may be a binary sparse matrix which includes a set of circulant matrices of size Z×Z. The parity-check matrix H of a QC-LDPC code can be represented equivalently by an exponent matrix P=E(H). This representation can help to illustrate the graphical structure of the underlying code as a base graph along with coefficient of shifting.

In some implementations, a plurality of codebooks may be provided to generate parity check matrices. For example, the plurality of codebooks may include a first codebook and a second codebook. A codebook refers to a collection of codewords (or code vectors) or error correction codes (e.g., LDPC codes) used in error correction and/or data compression. Codewords refer to encoded representations generated by applying an error correction code to original data.

The first codebook for representing a block matrix P=E (H) may include [28 96 161 134 9 149 15 61 153 105 75 120 −1 98 146 63 149 147 46 −1 2 0 −1 −1; 138 127 148 114 128 156 114 130 14 33 103 −1 128 −1 136 18 96 124 109 55 −1 0 0 −1; 104 32 1 160 49 52 85 108 90 144 143 18 134 70 −1 117 −1 59 −1 107 0 −10 0; 33 58 73 83 89 114 119 75 101 49 −1 131 8 131 105 −1 9 −1 146 105 2 −1 −1 0] . . . (Codebook 1)

The second codebook for representing a block matrix P=E(H) may include [27 96 160 133 9 148 15 60 152 105 75 120 −1 98 146 63 149 147 46 −1 2 0 −1 −1; 138 126 148 113 128 155 114 130 13 33 103 −1 128 −1 136 18 96 124 109 55 −1 0 0 −1; 103 31 1 160 48 51 84 108 89 143 143 18 134 70 −1 117 −1 59 −1 107 0 −10 0; 33 58 73 83 89 113 119 75 100 49 −1 131 8 131 105 −1 9 −1 146 105 2 −1 −1 0] . . . (Codebook 2)

In some implementations, a parity check matrix H may be generated from an exponent matrix P=E(H) using a codebook. The exponent matrix P=E(H) may include (as elements) shift values d in the range 0<=d<Z along with d=−1. For example, if Z=7, the shift values d may include −1, 0, 1, 2, 3, 4, 5, 6. The shift value d=0 may correspond (or map) to an identity matrix of size Z×Z, denoted by I(Z). The shift value d=−1 may correspond (or map) to a null matrix (all elements zero) of size Z×Z, denoted by 0*I(Z). Any other integer value d in [1,Z−1] may correspond (or map) to a matrix cyclically right shifted from I(Z). The parity check matrix H can be obtained from the exponent matrix P=E(H) by expanding the exponent matrix P such that each element of the exponent matrix P (as a shift value d) is replaced by a matrix corresponding to the shift value.

In some implementations, the exponent matrix P=E(H) may include a plurality of elements P1,1, P1,2, P1,3, . . . , P1,ń; P2,1, P2,2, P2,3, . . . , P2,ń; . . . , P1,1, P1,2, P1,3, . . . , P1,ń, which correspond to (ḿ×ń) values of a codebook where in and n satisfy the following equations:

$$\acute{m} = n(1 - R)/Z \qquad \text{(Equation 5)}$$

$$\acute{n} = n/Z \qquad \text{(Equation 6)}$$

The exponent matrix (or permutation matrix) P=E(H) may be expressed as following:

$$P \equiv E(H) = \begin{pmatrix} P_{1,1} & P_{1,2} & P_{1,3} & \dots & \dots & P_{1,\acute{n}} \\ P_{2,1} & P_{2,2} & P_{2,3} & \dots & \dots & P_{2,\acute{n}} \\ \dots & \ddots & \ddots & \dots & \dots & \vdots \\ P_{\acute{m},1} & P_{\acute{m},2} & P_{\acute{m},3} & \dots & \dots & P_{\acute{m},\acute{n}} \end{pmatrix} \qquad \text{(Equation 7)}$$

The corresponding parity check matrix H may be obtained by replacing each element of the matrix (as a shift value d) by a matrix C(d) corresponding to the shift value as follows:

$$H = \begin{pmatrix} C(P_{1,1}) & C(P_{1,2}) & C(P_{1,3}) & \dots & \dots & C\left(P_{1,\acute{n}}\right) \\ C(P_{2,1}) & C(P_{2,2}) & C(P_{2,3}) & \dots & \dots & C\left(P_{2,\acute{n}}\right) \\ \dots & \ddots & \ddots & \dots & \dots & \vdots \\ C\left(P_{\acute{m},1}\right) & C\left(P_{\acute{m},2}\right) & C\left(P_{\acute{m},3}\right) & \dots & \dots & C\left(P_{\acute{m},\acute{n}}\right) \end{pmatrix} \qquad \text{(Equation 8)}$$

For example, a matrix C(1) may be expressed as follows:

$$C(1) = \begin{pmatrix} 0 & 1 & 0 & \dots & \dots & 0 \\ 0 & 0 & 1 & \dots & \dots & \ddots \\ \ddots & \ddots & \ddots & \dots & \dots & \vdots \\ 0 & 0 & 0 & \dots & \dots & 1 \\ 1 & 0 & 0 & \dots & \dots & 0 \end{pmatrix} \qquad \text{(Equation 9)}$$

In some implementations, an encoder can produce codewords using a generator matrix (e.g., using Equation 2). In some implementations, an encoder can use the parity check matrix (rather than the generator matrix) to produce codewords from vectors of information bits. After a parity check matrix H is obtained (e.g., using a codebook), the parity check matrix H may have sub-matrices A, B, C, D, T, E. An upper area O of the sub-matrix T may correspond to an area in which the matrix contains all zeroes, and the other areas may represent locations that can contain ones.

In some implementations, the codeword c can be obtained by the following expression:

$$c = [s \, p_1 \, p_2], \qquad \text{(Equation 10)}$$

where "s" is the vector of information bits to be encoded, "p₁" is a vector of the first g parity bits and "p₂" is a vector of the remaining m-g parity bits.

The vectors $p_1$ and $p_2$ can be obtained by the following equations:

$$\Phi = -ET^{-1}B + D; \qquad \text{(Equation 11)}$$

$$p_1^T = \Phi^{-1}\left(-ET^{-1}A + C\right)s^T; \text{ and} \qquad \text{(Equation 12)}$$

$$p_2^T = -T^{-1}\left(As^T + Bp_1^T\right). \qquad \text{(Equation 13)}$$

Although various embodiments disclosed herein are described for encoding data for a wireless communication (e.g., wireless local area network (WLAN) conforming to any IEEE 802.11 standard), principles disclosed herein are applicable to other types of communication (e.g., wired communication) or any process that performs encoding for LDPC codes.

In some implementations, an apparatus may include a transmitter and one or more processors. The one or more processors may be configured to generate, according to a code rate of 5/6, a first binary parity check matrix for a QC-LDPC code using a first matrix having 96 values. The first matrix comprises at least 94 values selected from the following set of values: [28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0]. The one or more processors may be configured to encode data using the generated first binary parity check matrix. The one or more processors may be configured to cause the transmitter to transmit the encoded data. In some implementations, the first binary parity check matrix may be generated according to a size of 3888 bits. The one or more processors are further configured to shift one or two values of the first matrix from one or more corresponding positive values of the set of values by −1 or +1. The one or more corresponding positive values of the set of values may not be selected as the at least 94 values.

In some implementations, an apparatus may include a transmitter and one or more processors. The one or more processors may be configured to generate, according to a code rate of 5/6, a first binary parity check matrix for a QC-LDPC code using a first matrix having 96 values. The first matrix comprises at least 94 values selected from the following set of values: [27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −1 9 −1 146 105 2 −1 −1 0]. The one or more processors may be configured to encode data using the generated first binary parity check matrix. The one or more processors may be configured to cause the transmitter to transmit the encoded data. In some implementations, the first binary parity check matrix may be generated according to a size of 3888 bits. The one or more processors are further configured to shift one or two values of the first matrix from one or more corresponding positive values of the set of values by −1 or +1. The one or more corresponding positive values of the set of values may not be selected as the at least 94 values.

Embodiments in the present disclosure have at least the following advantages and benefits. First, embodiments in the present disclosure can provide useful techniques for providing significant gains across all modulation schemes.

For example, the block length (e.g., 3888 bits) of an QC-LDPC code according to some implementations is at least 2 times that of the longest code supported in 802.11n-802.11be standards (e.g., 1994 bits). This QC-LDPC code can provide about 2 dB gain in 2×2 MIMO (multiple input multiple output) channels and the gains are consistent across all modulation schemes with or without beamforming.

Second, embodiments in the present disclosure can provide useful techniques for providing significant gains (e.g., 0.5 dB~1.2 dB gain in SNR (signal to noise ratio) over existing codes) across all modulation schemes. For example, the block length (e.g., 3888 bits) of an QC-LDPC code according to some implementations is at least 2 times that of the longest code supported in 802.11n-802.11be standards (e.g., 1994 bits). This QC-LDPC code can provide about 2 dB gain in 2×2 MIMO channels and the gains are consistent across all modulation schemes with or without beamforming.

Third, embodiments in the present disclosure can provide a code book and construction methods of constructing the code book. In some implementations, QC-LDPC code can be constructed by slight nudging of the cyclic shift values of the parity check matrices.

Referring to FIG. 1, illustrated is a diagram depicting an example communication environment 100 including communication systems (or communication apparatuses) 105, 108, according to one or more embodiments. In one embodiment, the communication system 105 includes a baseband circuitry 110 and a transmitter circuitry 120, and the communication system 108 includes a baseband circuitry 150 and a receiver circuitry 140. In one aspect, the communication system 105 is considered a transmitter communication system, and the communication system 108 is considered a receiver communication system. These components operate together to exchange data (e.g., messages or frames) through a wireless medium. These components are embodied as application specific integrated circuit (ASIC), field programmable gate array (FPGA), or any combination of these, in one or more embodiments. In some implementations, the communication systems 105, 108 include more, fewer, or different components than shown in FIG. 1. For example, each of the communication systems 105, 108 includes transceiver circuitry to allow bi-directional communication between the communication systems 105, 108 or with other communication systems. In some implementations, each of the communication systems 105, 108 may have configuration similar to that of a computing system 2000 as shown in FIG. 2.

The baseband circuitry 110 of the communication system 105 is a circuitry that generates the baseband data 115 for transmission. The baseband data 115 includes information data (e.g., signal(s)) at a baseband frequency for transmission. In one approach, the baseband circuitry 110 includes an encoder 130 that encodes the data, and generates or outputs parity bits. In one aspect, the baseband circuitry 110 (or encoder 130) obtains a generator matrix or a parity check matrix, or uses a previously produced generator matrix or a previously produced parity check matrix, and encodes the information data by applying the information data to the generator matrix or the parity check matrix to obtain a codeword. In some implementations, the baseband circuitry 110 stores one or more generator matrices or one or more parity check matrices that conform to any IEEE 802.11 standard for WLAN communication. The baseband circuitry 110 retrieves the stored generator matrix or the stored parity check matrix in response to detecting information data to be transmitted, or in response to receiving an instruction to encode the information data. In one approach, the baseband circuitry 110 generates the parity bits according to a portion of the generator matrix or using the parity check matrix, and appends the parity bits to the information bits to form a codeword. The baseband circuitry 110 generates the baseband data 115 including the codeword for the communication system 108, and provides the baseband data 115 to the transmitter circuitry 120.

The transmitter circuitry 120 of the communication system 105 includes or corresponds to a circuitry that receives the baseband data 115 from the baseband circuitry 110 and transmits a wireless signal 125 according to the baseband data 115. In one configuration, the transmitter circuitry 120 is coupled between the baseband circuitry 110 and an antenna (not shown). In this configuration, the transmitter circuitry 120 up-converts the baseband data 115 from the baseband circuitry 110 onto a carrier signal to generate the wireless signal 125 at an RF frequency (e.g., 10 MHz to 60 GHz), and transmits the wireless signal 125 through the antenna.

The receiver circuitry 140 of the communication system 108 is a circuitry that receives the wireless signal 125 from the communication system 105 and obtains baseband data 145 from the received wireless signal 125. In one configuration, the receiver circuitry 140 is coupled between the baseband circuitry 150 and an antenna (not shown). In this configuration, the receiver circuitry 140 receives the wireless signal 125 though an antenna, and down-converts the wireless signal 125 at an RF frequency according to a carrier signal to obtain the baseband data 145 from the wireless signal 125. The receiver circuitry 140 then provides the baseband data 145 to the baseband circuitry 150.

The baseband circuitry 150 of the communication system 108 includes or corresponds to a circuitry that receives the baseband data 145 from the receiver circuitry 140 and obtains information data from the received baseband data 145. In one embodiment, the baseband circuitry 150 includes a decoder 160 that extracts information and parity bits from the baseband data 145. The decoder 160 decodes the baseband data 145 to obtain the information data generated by the baseband circuitry 110 of the communication system 105.

In some implementations, each of the baseband circuitry 110 (including the encoder 130), the transmitter circuitry 120, the receiver circuitry 140, and the baseband circuitry 150 (including the decoder 160) may be as one or more processors, application specific integrated circuit (ASIC), field programmable gate array (FPGA), or any combination of them.

FIG. 2 is a schematic block diagram of a computing system, according to an embodiment. An illustrated example computing system 2000 includes one or more processors 2010 in direct or indirect communication, via a communication system 2040 (e.g., bus), with memory 2060, at least one network interface controller 2030 with network interface port for connection to a network (not shown), and other components, e.g., input/output ("I/O") components 2050. Generally, the processor(s) 2010 will execute instructions (or computer programs) received from memory. The processor(s) 2010 illustrated incorporate, or are connected to, cache memory 2020. In some instances, instructions are read from memory 2060 into cache memory 2020 and executed by the processor(s) 2010 from cache memory 2020. The computing system 2000 may not necessarily contain all of these components shown in FIG. 2, and may contain other components that are not shown in FIG. 2.

In more detail, the processor(s) 2010 may be any logic circuitry that processes instructions, e.g., instructions fetched from the memory 2060 or cache 2020. In many implementations, the processor(s) 2010 are microprocessor units or special purpose processors. The computing device 2050 may be based on any processor, or set of processors, capable of operating as described herein. The processor(s) 2010 may be single core or multi-core processor(s). The processor(s) 2010 may be multiple distinct processors.

The memory 2060 may be any device suitable for storing computer readable data. The memory 2060 may be a device with fixed storage or a device for reading removable storage media. Examples include all forms of volatile memory (e.g., RAM), non-volatile memory, media and memory devices, semiconductor memory devices (e.g., EPROM, EEPROM, SDRAM, and flash memory devices), magnetic disks, magneto optical disks, and optical discs (e.g., CD ROM, DVD-ROM, or Blu-Ray® discs). A computing system 2000 may have any number of memory devices 2060.

The cache memory 2020 is generally a form of computer memory placed in close proximity to the processor(s) 2010 for fast read times. In some implementations, the cache memory 2020 is part of, or on the same chip as, the processor(s) 2010. In some implementations, there are multiple levels of cache 2020, e.g., L2 and L3 cache layers.

The network interface controller 2030 manages data exchanges via the network interface (sometimes referred to as network interface ports). The network interface controller 2030 handles the physical and data link layers of the OSI model for network communication. In some implementations, some of the network interface controller's tasks are handled by one or more of the processor(s) 2010. In some implementations, the network interface controller 2030 is part of a processor 2010. In some implementations, the computing system 2000 has multiple network interfaces controlled by a single controller 2030. In some implementations, the computing system 2000 has multiple network interface controllers 2030. In some implementations, each network interface is a connection point for a physical network link (e.g., a cat-5 Ethernet link). In some implementations, the network interface controller 2030 supports wireless network connections and an interface port is a wireless (e.g., radio) receiver or transmitter (e.g., for any of the IEEE 802.11 protocols, near field communication "NFC", Bluetooth, ANT, or any other wireless protocol). In some implementations, the network interface controller 2030 implements one or more network protocols such as Ethernet. Generally, a computing device 2050 exchanges data with other computing devices via physical or wireless links through a network interface. The network interface may link directly to another device or to another device via an intermediary device, e.g., a network device such as a hub, a bridge, a switch, or a router, connecting the computing device 2000 to a data network such as the Internet.

The computing system 2000 may include, or provide interfaces for, one or more input or output ("I/O") devices. Input devices include, without limitation, keyboards, microphones, touch screens, foot pedals, sensors, MIDI devices, and pointing devices such as a mouse or trackball. Output devices include, without limitation, video displays, speakers, refreshable Braille terminal, lights, MIDI devices, and 2-D or 3-D printers.

Other components may include an I/O interface, external serial device ports, and any additional co-processors. For example, a computing system 2000 may include an interface (e.g., a universal serial bus (USB) interface) for connecting input devices, output devices, or additional memory devices (e.g., portable flash drive or external media drive). In some implementations, a computing device 2000 includes an additional device such as a co-processor, e.g., a math co-processor can assist the processor 2010 with high precision or complex calculations.

The components 2090 may be configured to connect with external media, a display 2070, an input device 2080 or any other components in the computing system 2000, or combinations thereof. The display 2070 may be a liquid crystal display (LCD), an organic light emitting diode (OLED) display, a flat panel display, a solid state display, a cathode ray tube (CRT) display, a projector, a printer or other now known or later developed display device for outputting determined information. The display 2070 may act as an interface for the user to see the functioning of the processor(s) 2010, or specifically as an interface with the software stored in the memory 2060.

The input device 2080 may be configured to allow a user to interact with any of the components of the computing system 2000. The input device 2080 may be a plurality pad, a keyboard, a cursor control device, such as a mouse, or a joystick. Also, the input device 2080 may be a remote control, touchscreen display (which may be a combination of the display 2070 and the input device 2080), or any other device operative to interact with the computing system 2000, such as any device operative to act as an interface between a user and the computing system 2000.

Figure 3:
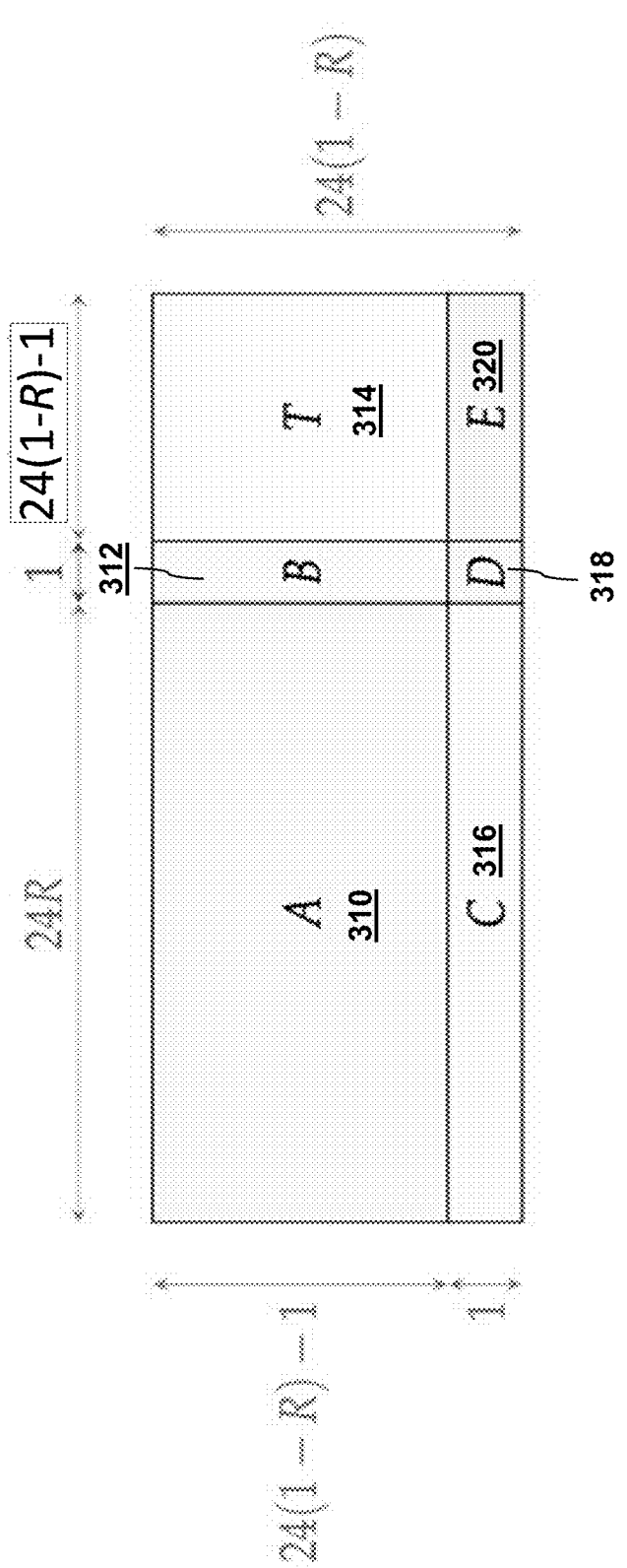
FIG. 3 is a diagram depicting an example exponent matrix, according to one or more embodiments.

FIG. 3 is a diagram depicting an example exponent matrix (QC-LDPC exponent matrix) 300, according to one or more embodiments. Given a lifting size Z, the exponent matrix 300 may have a size of m/Z×n/Z. If n=24Z (e.g., n=3888, Z=162), then the size of P=E(H) is 24(1–R)×24 (=n(1–R)/Z×n/Z). Elements of the exponent matrix may be integer values which correspond to cyclic shift values of identity matrix of size Z×Z. A parity check matrix H (see FIG. 5) may be a sparse binary matrix that can be derived from an exponent matrix P=E(H). The generator matrix G may have a size n×k in binary form (e.g., elements of the generator matrix G are binary values). Referring to FIG. 3, the exponent matrix P=E(H) may have a structure including a plurality of sub-matrices (e.g., A 310, B 312, C 316, D 318, E 320, T 314).

Figure 4:
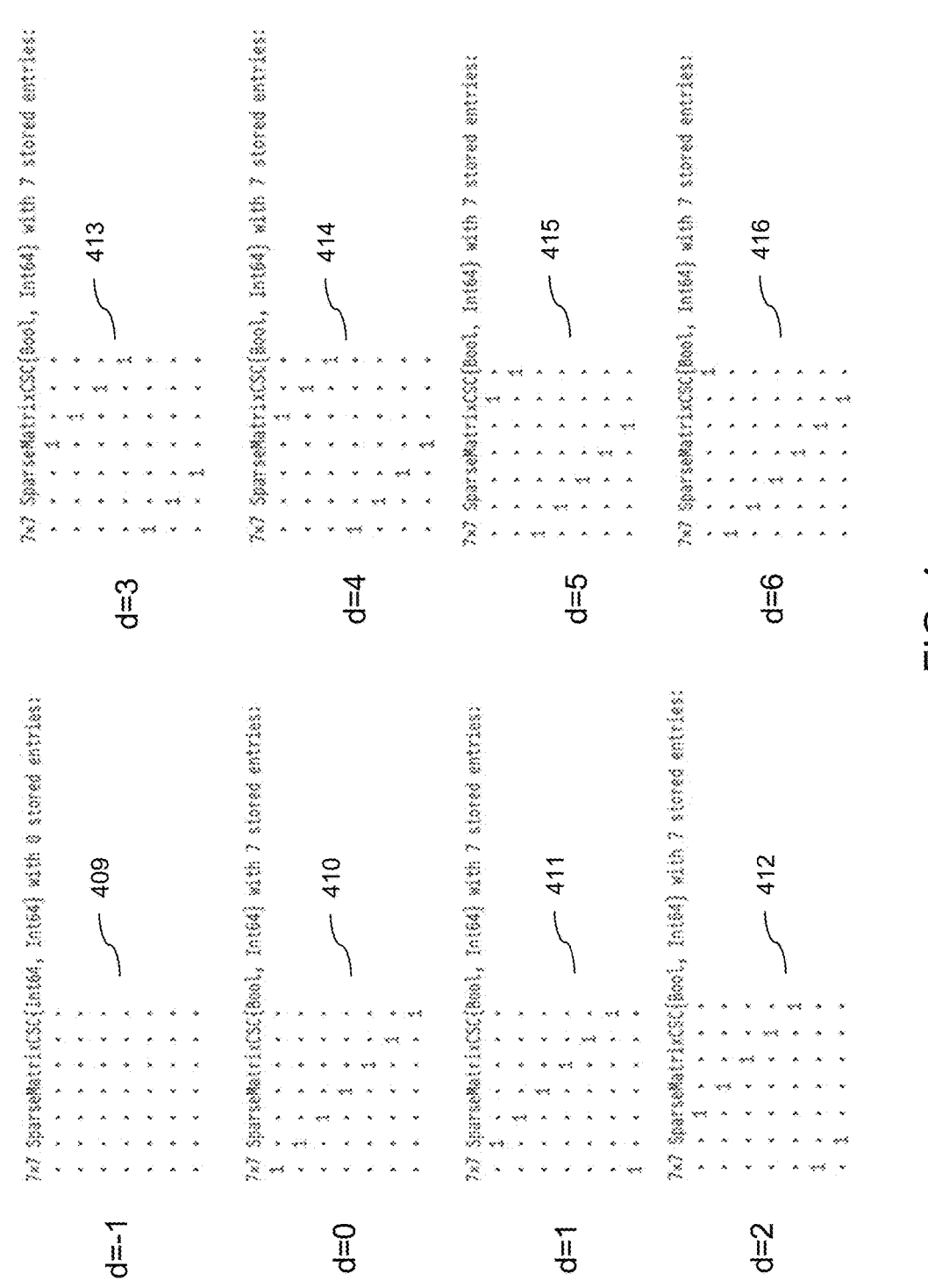
FIG. 4 is a diagram depicting example shifted identity matrices for generating a parity check matrix, according to one or more embodiments.

FIG. 4 is a diagram 400 depicting example shifted identity matrices 409, 410, 411, 412, 413, 414, 415, 416 for generating a parity check matrix, according to one or more embodiments. A parity check matrix H may be generated from an exponent matrix P=E(H) (e.g., exponent matrix 300) using a codebook (e.g., Codebook 1 or Codebook 2). As shown in Equation 7, the exponent matrix P=E(H) may include (as elements) shift values d in the range 0<=d<Z along with d=−1. See Equation For example, if Z=7, the shift values d may include −1, 0, 1, 2, 3, 4, 5, 6 (see FIG. 4). The shift value d=0 may correspond (or map) to an identity matrix of size Z×Z, denoted by I(Z) (e.g., matrix 410). The shift value d=−1 may correspond (or map) to a null matrix (all elements zero) of size Z×Z, denoted by 0*I(Z) (e.g., matrix 409). Any other integer value d in [1,Z–1] may correspond (or map) to a matrix cyclically right shifted from I(Z) (e.g., matrices 411, 412, 413, 414, 415, 416). As shown in Equation 8, the parity check matrix H can be obtained from the exponent matrix P=E(H) by expanding the exponent matrix P such that each element of the exponent matrix P (as a shift value d) is replaced by a matrix corresponding to the shift value.

Figure 5:
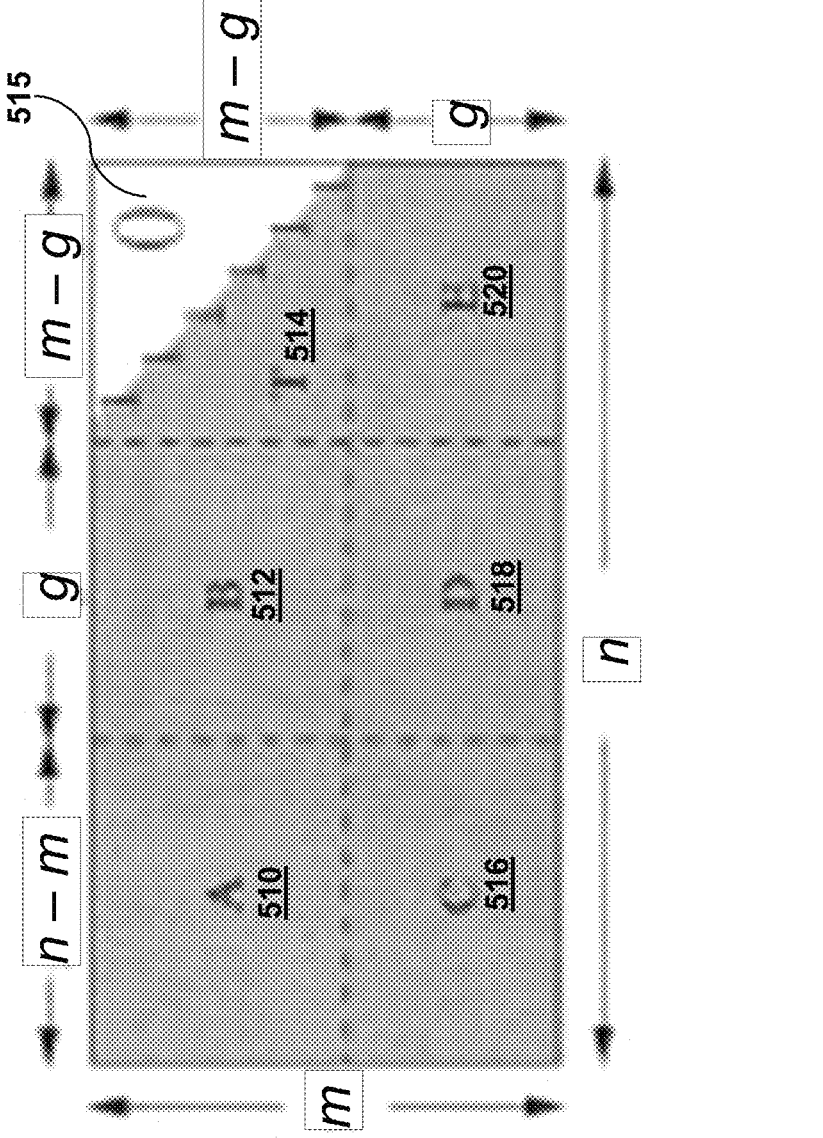
FIG. 5 is a diagram depicting an example parity check matrix, according to one or more embodiments.

FIG. 5 is a diagram depicting an example parity check matrix 500, according to one or more embodiments. In some implementations, an encoder (e.g., encoder 130) can produce codewords using a generator matrix (e.g., using Equation 2). In some implementations, an encoder (e.g., encoder 130) can use the parity check matrix (rather than the generator matrix) to produce codewords from vectors of information bits. After a parity check matrix H is obtained (e.g., using a codebook), the parity check matrix H (e.g., parity check matrix 500) may have sub-matrices A 510, B 512, C 516, D 518, T 514, E 520. An upper area O 515 of the sub-matrix T 514 (e.g., white area in FIG. 5) may correspond to an area in which the matrix contains all zeroes, and the other areas (e.g., grey area in FIG. 5) may represent locations that can contain ones. The size of the parity check matrix 500 may be m×n where the size of the sub-matrix D 518 is g×g, and the size of the sub-matrix T is (m–g)×(m–g). In some implementations, given a vector s of information bits to be encoded, the encoder can obtain a codeword c using Equation 10, Equation 11, Equation 12 and Equation 13.

In some implementations, a codebook for R=5/6 LDPC code of blocklength=3888 bits can provide high performance error correction and/or provide up to 1.2 dB gain over existing LDPC codes specified in the Wi-Fi standards. In some implementations, a collection of LDPC codes with a block length of 3888 bits (2×1944), supporting all the code rates in a Wi-Fi standard (e.g., 802.11be). The code (e.g., R=5/6 LDPC code of blocklength=3888 bits) can be directly used in an existing modulation of 64-QAM in the IEEE 802.11be and potentially in combination with more combinations of QAM sizes in the IEEE 802.bn.

The collection of LDPC codes with a block length of 3888 bits (2×1944) can deliver considerable performance improvements in various communication scenarios in ultra high reliability (UHR), while maintaining manageable complexity. Performance comparisons are conducted between these codes and LDPC codes specified in the IEEE 802.11be standards, as well as recently proposed codes with a block length of 4×1944. Results of the performance comparisons show demonstrable gains across the board (e.g., channels, PHY bandwidth, MIMO, modulation coding scheme (MCS), Transmit Beamforming). For example, LDPC codes with a block length of 3888 bits according to some implementations can provides 0.5-1.0 dB gains over the present 802.11 LDPC codes, depending on channel conditions. LDPC codes with a block length of 4×1944 bits can provide additional 0.0-0.5 dB gain, depending on channel conditions.

The longest LDPC codes specified in 802.11be standards have block length=1944 bits. Performance wise, the LDPC codes specified in 802.11be standards are about 2.7 dB away from the optimum random codes (e.g., bit-interleaved coded modulation (BICM)-additive white Gaussian noise (AWGN)-QAM (Quadrature Amplitude Modulation) R=5/6 limits). Longer blocklength random codes (e.g., the Shannon limit deals with the asymptotic case when the blocklength grows unboundedly large) can lead to enhanced coding gains, in accordance with the finite-length scaling laws. Deterministic codes, which are suboptimal, can exhibit scaling gains that are significantly larger than those of optimal random codes. For example, in AWGN a doubling effect is known to be true.

In some implementations, LDPC codes with blocklength=2×1944=3888 bits (which double the size of maximum supported blocklength in the present 802.11be standards). In some implementations, LDPC codes with blocklength=3888 bits can support all the existing code rates (e.g., R=1/2, 2/3, 3/4 and 5/6). In some implementations, LDPC codes with blocklength=3888 bits can keep the structure of the 802.11be code, QC-LDPC specifically, unchanged, except for the matrix size expansion. This adaptation can facilitate the reutilization of existing implementations and to empower concurrent encoding and decoding functionalities.

Figure 6A:
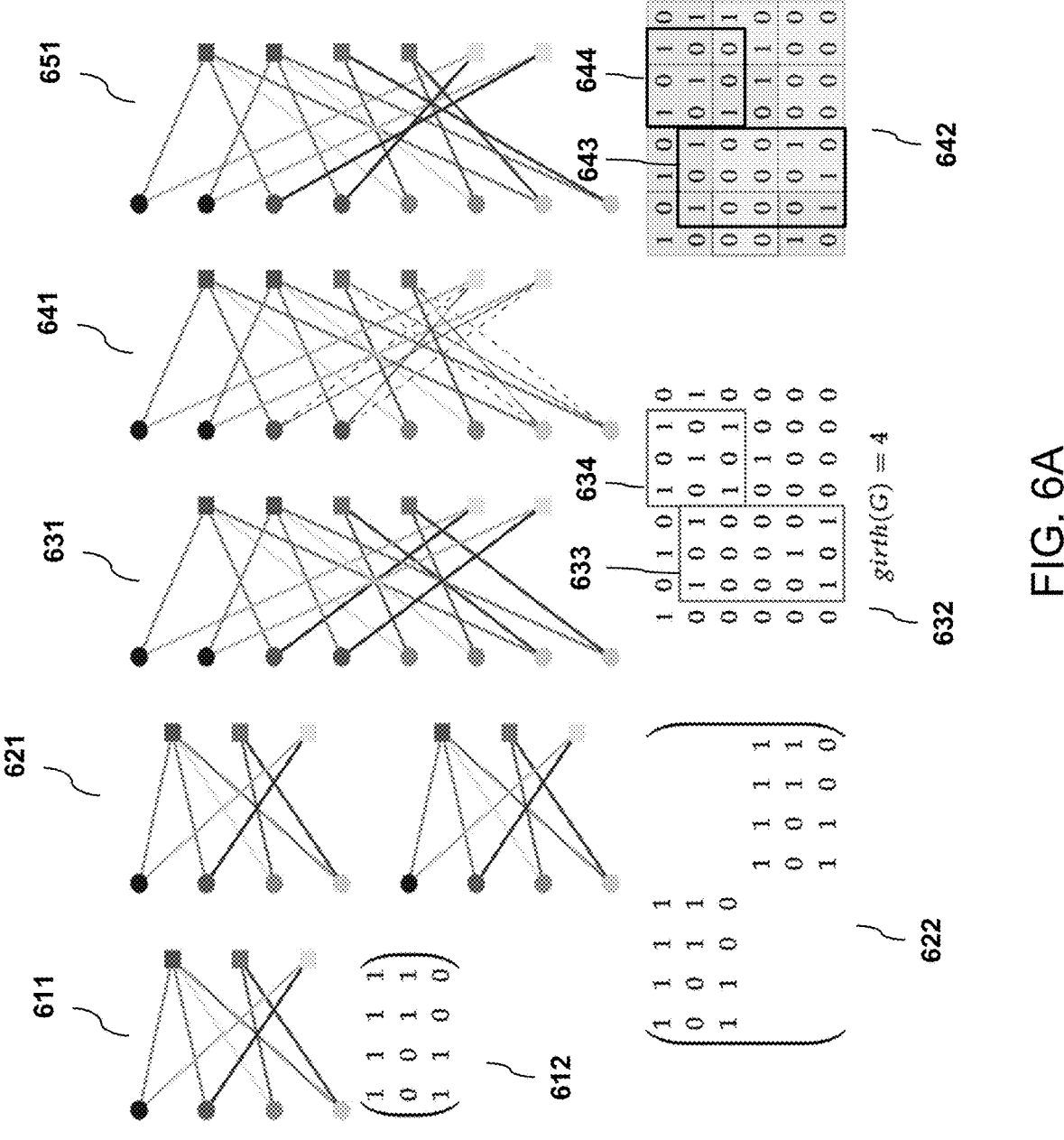
FIGS. 6A and 6B are diagrams depicting an example code design using a protograph lifting concept/method, according to one or more embodiments.
Figure 6B:
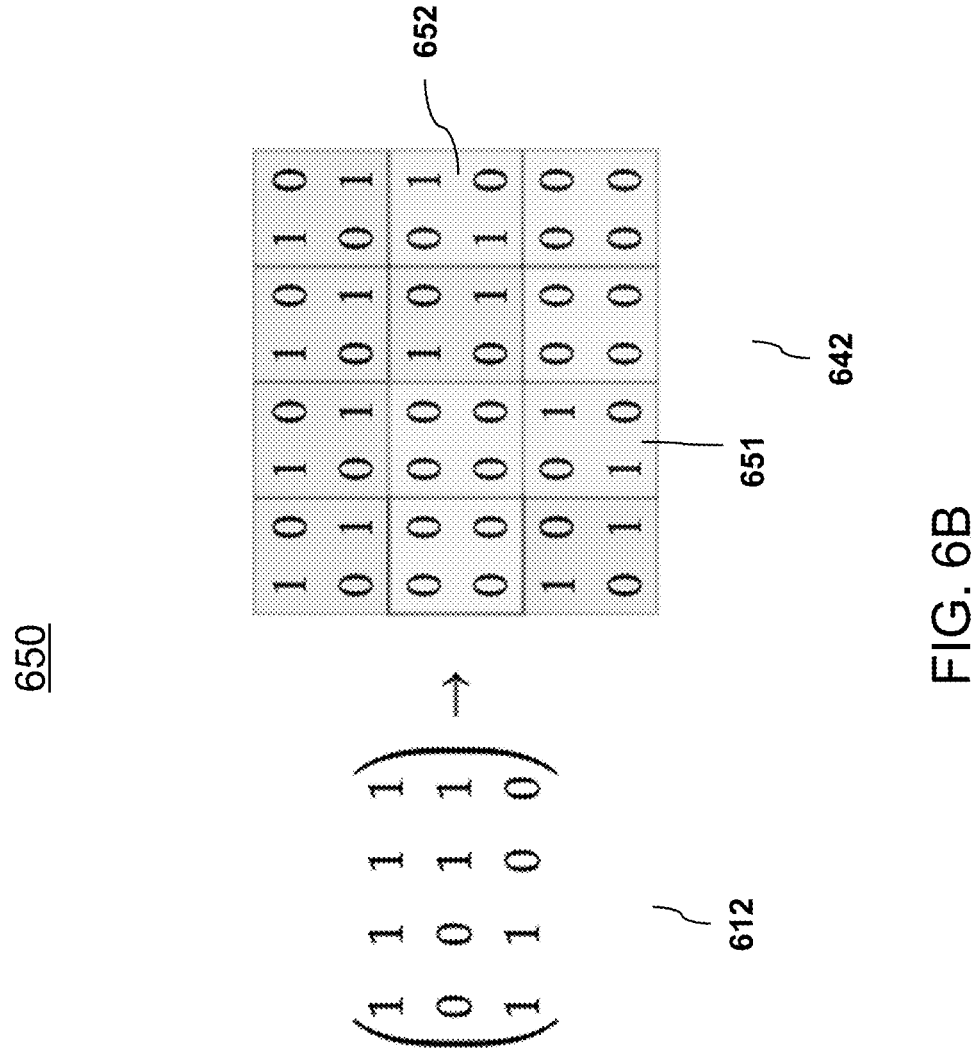

FIGS. 6A and 6B are diagrams depicting an example code design using a protograph lifting concept/method, according to one or more embodiments.

FIG. 6A is a diagram 600 depicting design/generation/creation/definition of an example code design using a protograph lifting concept/method, according to one or more embodiments. A "protograph" may refer to a bipartite graph having two disjoint and independent vertex sets (e.g., a set of left vertexes indicated by circles and a set of right vertexes indicated by rectangles in the protograph 611) to represent a matrix (e.g., parity check matrix 611). A system according to some implementations (e.g., communication system 105 or 108) may use a code with blocklength=1944 as a base code (e.g., a protograph 611 and the corresponding (parity check) matrix 612). The system may lift (e.g., copy) the base code by 2 (e.g., a protograph 621 and a (parity check) matrix 622 corresponding to the protograph 621). The system may (1) permute/move/shift/migrate the edges of a protograph (e.g., from the protograph 621 to the protograph 631; equivalently permuting columns of the matrix 622 to obtain the matrix 632); and/or (2) remove 4-cycles (and possibly all short cycles) from the protograph (e.g., protographs 631 and a (parity check) matrix 632 corresponding to the protographs 631) to obtain a protograph 641. For example, as shown in FIG. 6A, the cycle represented by a sub-matrix 633 in a protograph 631 may be removed in the protograph 641 corresponding to the matrix 642 (see a sub-matrix 643). Similarly, the cycle represented by a sub-matrix 634 in the protograph 631 may be removed in the protograph 641 corresponding to the matrix 642 (see a sub-matrix 644).

In some implementations, the system may generate/define/design/create (as a design target) a code representing a protograph with a girth>6. The "girth" of an undirected graph may refer to the length of the shortest cycle contained within the graph. In some implementations, the system may generate/define/design/create (as a design target) a code corresponding to a protograph with a girth>10. For example, as shown in FIG. 6A, the protograph 631 (and the corresponding (parity check) matrix 632) has a girth of 4, while the protographs 641, 651 (and their corresponding (parity check) matrix 642) each have a girth of greater than 6. In some implementations, the system may add and/or delete edges to boost performance without increasing the girth. For example, edges may be added to and/or deleted from the parity check matrix 642, to boost performance without increasing the girth of the protographs 641, 651 (or the girth of their corresponding (parity check) matrix 642).

FIG. 6B is a diagram 650 depicting an example parity check matrix of a QC-LDPC code, according to one or more embodiments. In some implementations, a system according to some implementations (e.g., communication system 105 or 108) may obtain the parity check matrix 642 of the new code (see FIG. 6) which is the same as the parity check matrix 762, by embedding 2×2 binary matrices in the original parity check matrix H (e.g., parity check matrix 612 as a base code). For example, the system may (1) replace an element "1" in the original parity check matrix 612 with a 2×2 binary identity matrix $$\begin{pmatrix} 1 & 0 \\ 0 & 1 \end{pmatrix};$$

and/or (2) further modify the replaced identity matrix. For example, after embedding 2×2 binary identity matrices, the system may modify some of the embedded 2×2 binary identity matrices, resulting in the modified binary matrices 651, 652 which corresponds to modified edges in the corresponding protograph.

In some implementations, a system (e.g., communication system 103, 108) may include one or more processors (e.g., one or more processors 2010) configured to select, according to a first size (e.g., 1944 bits) and a code rate of 5/6, a codebook from a plurality of codebooks for a QC-LDPC code. The first size may be a size of a code block that is a result of encoding an information block, and the code rate may be a ratio of a size of the information block to the first size. The one or more processors may be configured to genera a first parity check matrix (e.g., parity check matrix 612 in FIG. 6A) based at least on the codebook. For example, the first parity check matrix may correspond to a block length of 1944 bits and the code rate of 5/6. The one or more processors may generate, using two instances of the first parity check matrix (e.g., two instances of the parity check matrix 612 in FIG. 6A), a second parity check matrix (e.g., parity check matrix 642 in FIG. 6A) corresponding to a second size and the code rate. The second size may be twice the first size. For example, the second parity check matrix may correspond to a block length of 3888 bits and the code rate of 5/6.

In some implementations, the system may generate the second parity check matrix using a first protograph corresponding to the first parity check matrix (e.g., protograph 611). The system may (1) lift (e.g., copy) the first protograph by 2 (e.g., lifting the protograph 611 by 2 to create the protograph 631); and/or (2) permute/move/shift/migrate the edges of the lifted protograph (e.g., protograph 631) to remove one or more short cycles from the lifted protograph, obtaining a second protograph (e.g., protograph 651) such that the girth of the second protograph is greater than 6 (or greater than 10). In some implementations, the system may further add one or more edges to, or delete one or more edges from, the second protograph without increasing the girth of the protograph. The second protograph (or a protograph as a result of further addition/removal of edges) may correspond to the second parity check matrix (e.g., parity check matrix 642).

In some implementations, the system may generate the second parity check matrix by embedding 2×2 binary matrices in the first parity check matrix. For example, as shown in FIG. 6B, the system may replace each element of the first parity check matrix having a value "1" by a 2×2 binary matrix (e.g., 2×2 binary identity matrix), and/or further modify the replaced binary matrix (e.g., modified binary matrices 651, 652), thereby obtaining the second parity check matrix (e.g., parity check matrix 642).

Figure 7A:
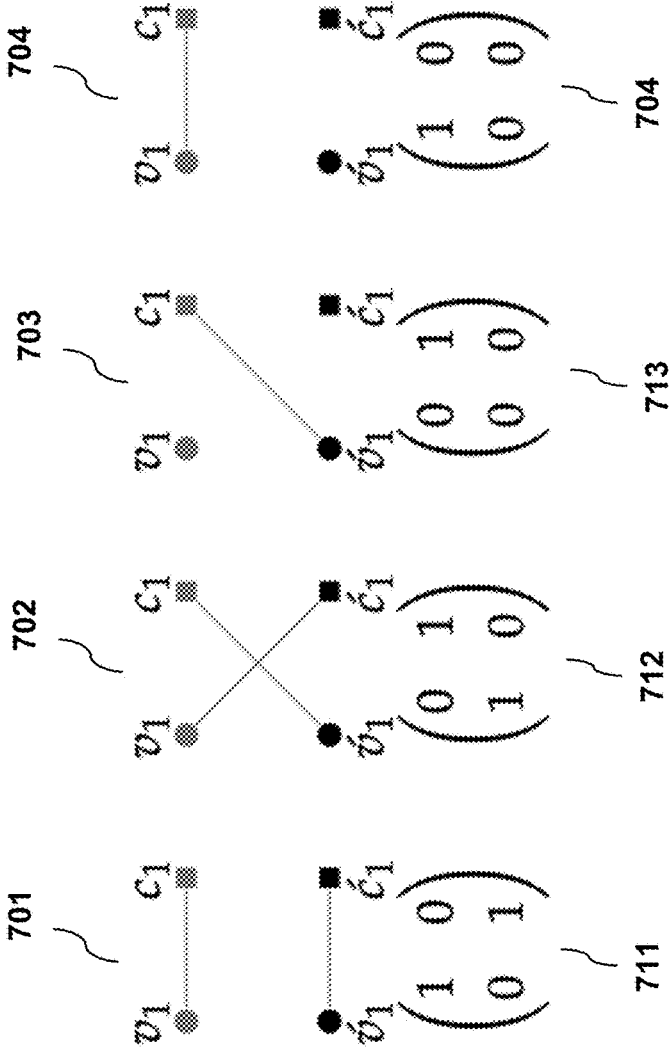
FIGS. 7A, 7B, 7C and 7D are diagrams depicting an example code for concurrent decoding, according to one or more embodiments.

FIGS. 7A, 7B, 7C and 7D are diagrams depicting an example code for concurrent decoding, according to one or more embodiments. FIG. 7A is a diagram 700 depicting example sub-matrix structures, according to one or more embodiments. There may be four different graph representations (or protographs) 701, 702, 703, 704 and corresponding sub-matrix structures 711, 712, 713, 714, respectively. In a sub-matrix structure, an (i, j) element (entry) of the sub-matrix indicates whether there is an edge between the $j^{th}$ column (e.g., vertex $v_1$ or $v'_1$ in FIG. 7A) and the $i^{th}$ row (e.g., vertex $c_1$ or $c'_1$ in FIG. 7A). For example, the sub-matrix structure 712 indicates that (1) there is no edge between $v_1$ and $c_1$; (2) there is no edge between $v'_1$ and $c'_1$; (2) there is an edge between $v_1$ and $c'_1$; and (2) there is an edge between $v'_1$ and $c_1$.

Figures 7B, 7C:
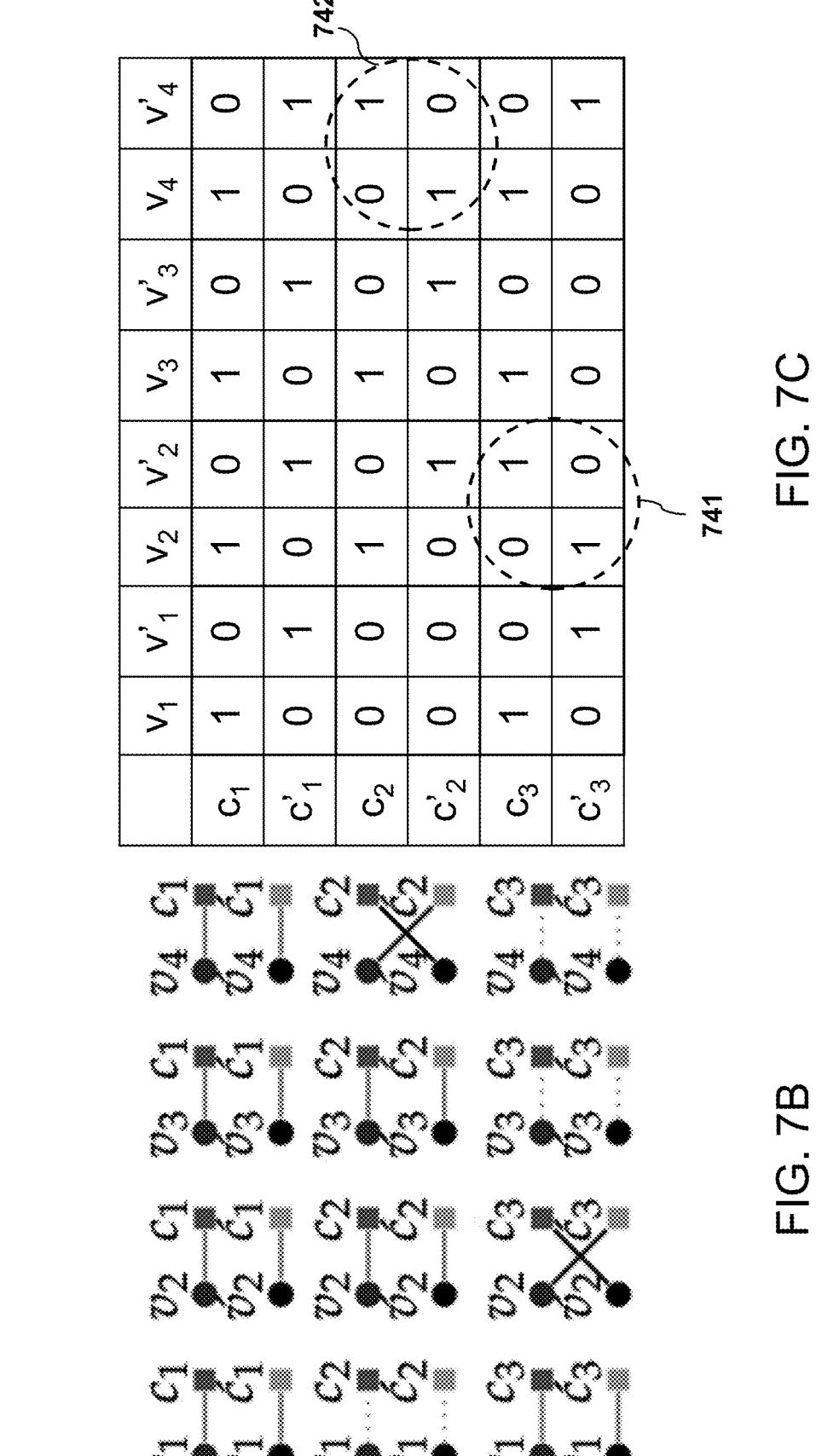
Figure 7D:
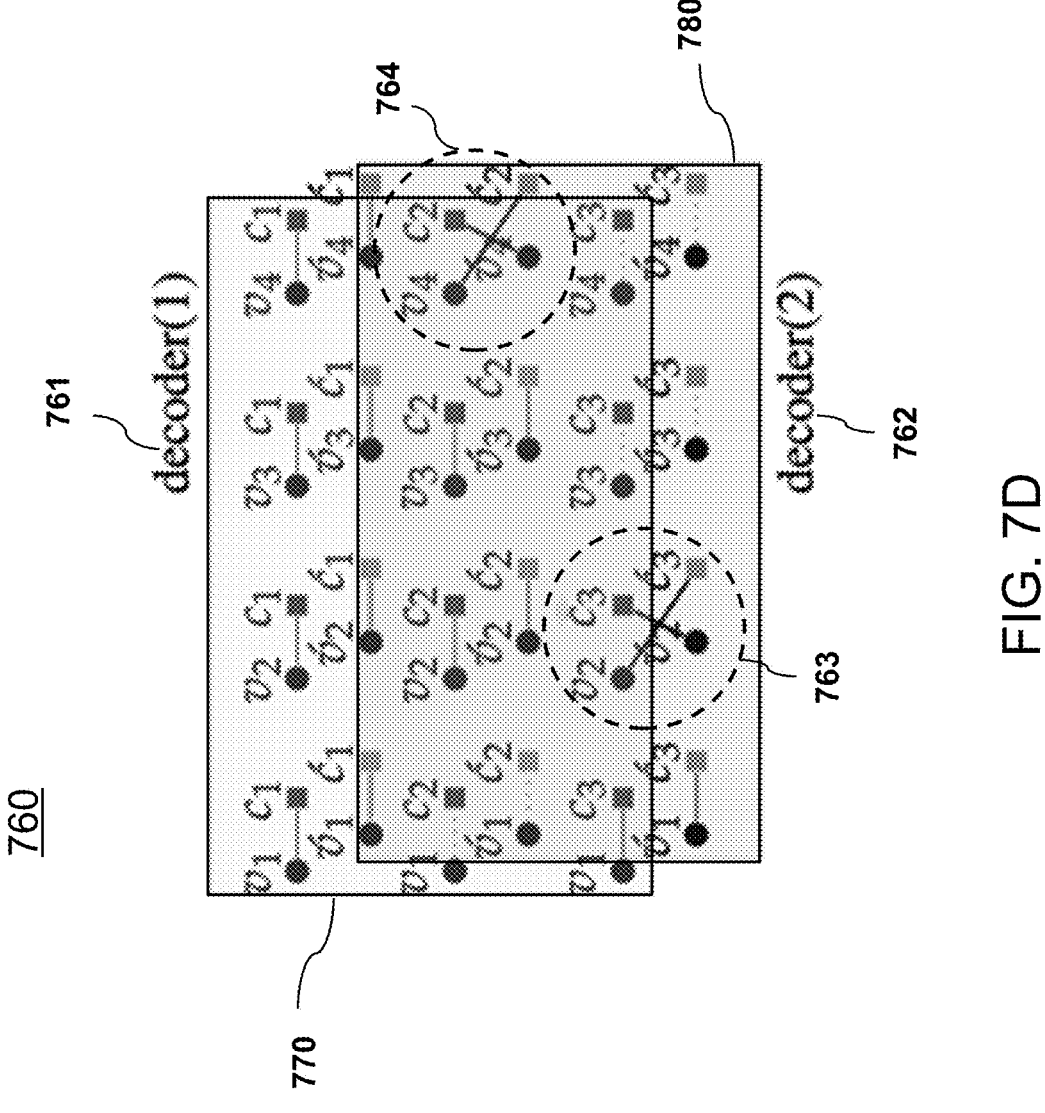

FIGS. 7B, 7C and 7D are diagrams 720, 740, 760 depicting an example code for concurrent decoding, according to one or more embodiments. LDPC codes according to some implementations allows for concurrent decoding using two decoders, each processing blocks of 1944 bits simultaneously. FIG. 7B shows a protograph 720 indicating edges between a first set of vertexes (e.g., $\{v_1, v'_1, v_2, v'_2, v_3, v'_3, v_4, v'_4\}$) and a second set of vertexes (e.g., $\{c_1, c'_1, c_2, c'_2, c_3, c'_3\}$). FIG. 7C shows a matrix 740 (e.g., parity check matrix) corresponding to the protograph 720. A system according to some implementations (e.g., communication system 108) may obtain the matrix 740 from the protograph 720 using the mapping between protographs and corresponding sub-matrix structures shown in FIG. 7A.

Referring to FIG. 7D, the diagram 760 shows an example of a concurrent decoding by decoder 1 (761) and decoder 2 (762) such that the two decoders can perform two 1944 block runs (as two layers) concurrently. In some implementations, the two decoders may be implemented in a decoder of a communication system (e.g., decoder 160 of communication system 108). For example, the first block run may correspond to a first subgraph 770 of the protograph 720, which indicates edges between the set of vertexes $\{v_1, v_2, v_3, v_4\}$ and the set of vertexes $\{c_1, c_2, c_3\}$. The second block run may correspond to a second subgraph 780 of the protograph 720, which indicates edges between the set of vertexes $\{v'_1, v'_2, v'_3, v'_4\}$ and the set of vertexes $\{c'_1, c'_2, c'_3\}$. In some implementations, the two decoders 761, 762 may perform a cross-layer message passing through connected edges between the two subgraphs of the protograph 720 (e.g., connected edges in a portion 763, connected edges in a portion 764). The connected edges in the portions 763 and 764 correspond to 2×2 circulant matrices 741 and 742 of the matrix 740 (see FIG. 7C), respectively. Here, a circulant matrix may refer to a square matrix in which all rows are composed of the same elements and each row is rotated one element to the right relative to the preceding row. The system can perform this concurrent decoding due to (or using) the sub-matrix structure (e.g., 2×2 circulant matrices 741 and 742). In some implementations, the 2×2 embedding can be changed for performance, without impacting concurrent decoding, since it is a fixed edge mapping between the two decoding layers.

FIG. 8 is a flow diagram showing a process 800 for encoding data using an LDPC code, in accordance with an embodiment. In some implementations, the process 800 is performed by one or more processors (e.g. communication system 105, encoder 130, or processor 2010). In other embodiments, the process 800 is performed by other entities. In some implementations, the process 800 includes more, fewer, or different steps than shown in FIG. 8.

At step 802, the one or more processors may determine a QC-LDPC code having a plurality of codebooks (e.g., Codebook 1 or Codebook 2) embedded therein. In some implementations, each codebook of the plurality of codebooks may include a plurality of integers (e.g., P1,1, P1,2, P1,3, . . . , P1,ń; P2,1, P2,2, P2,3, . . . , P2,ń; . . . , P1,1, P1,2, P1,3, . . . , Pṁ,ń as shown in Equation 7), the number of the plurality of integers being equal to the number of elements of the parity check matrix divided by z, where z is an integer representing a lifting size of the QC-LDPC code (e.g., Z=162). See Equation 5 and Equation 6.

In some implementations, each codebook of the plurality of codebooks (e.g., Codebook 1 or Codebook 2) may represent an exponent matrix (e.g., matrix 300) of the parity check matrix (e.g., matrix 500). Each element of the exponent matrix may correspond to a cyclic shift value of an identity matrix. A size of the identity matrix may be z×z, and the cyclic shift value d may be an integer such that $-1 \le d < z$, where Z is an integer representing a lifting size of the QC-LDPC code. The cyclic shift value d may represent a shifted identity matrix that is obtained by right-shifting the identity matrix by d (see FIG. 4 when z=7). The cyclic shift value −1 may represent a null matrix of the identity matrix (see matrix 409 in FIG. 4).

In some implementations, the code block size may be 3888 bits, and the code rate may be 5/6. The plurality of codebooks may include a first codebook and a second codebook. The first codebook (Codebook 1) may include [28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0]. The second codebook (Codebook 2) may include [27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −19 −1 146 105 2 −1 −1 0].

At step 804, the one or more processors may select a codebook from the plurality of codebooks according to a code block size (e.g., n=3888) and a code rate (e.g., R=5/6).

At step 806, the one or more processors may generate a parity check matrix (e.g., parity check matrix 500) based on the codebook (e.g., Codebook 1 or Codebook 2). In some implementations, in generating the parity check matrix based on the selected codebook, the one or more processors may generate an exponent matrix (e.g., matrix 300) based on the selected codebook. For each element of the exponent matrix, the one or more processors may generate a shifted identity matrix of an identity matrix (e.g., matrices 410, 411, 412, 413, 414, 415, 416) based on a value of each element of the exponent matrix (e.g., d=0, 1, 2, 3, 4, 5, 6). The one or more processors may generate the parity check matrix such that the parity check matrix includes, as an element corresponding to each element of the exponent matrix, the generated shifted identity matrix (see Equation 8)

At step 808, the one or more processors may encode data using the generated parity check matrix (e.g., using Equation 10, Equation 11, Equation 12 and Equation 13).

At step 810, the one or more processors may transmit, via a transmitter of the apparatus (e.g., transmitter circuitry 120 of the communication system 105), the encoded data to another apparatus (e.g., communication system 108).

In one approach, an apparatus may include a transmitter (e.g., transmitter circuitry 120 communication system 105) and one or more processors (e.g., encoder 130, or processor 2010 communication system 105). The one or more processors may be configured to identify (e.g., identify/select from a codebook), according to a code rate of 5/6 and a code block size of 3888 bits, a first binary parity check matrix (e.g., parity check matrix H) for a QC-LDPC code. The first binary parity check matrix may correspond to a first exponent matrix (e.g., exponent matrix P=E(H)) having 96 values.

The one or more processors may be configured to encode data using the first binary parity check matrix (e.g., using Equation 10, Equation 11, Equation 12 and Equation 13). The one or more processors may be configured to transmit the encoded data. For example, the first device (e.g., the communication system 105) may transmit the encoded data to a second device (e.g., the communication system 108).

In some implementations, the one or more processors may be further configured to generate the first exponent matrix by selecting at least 94 values from a second exponent matrix having the same dimensions as dimensions of the first exponent matrix (e.g., 4×24; 4 rows and 24 columns). In some embodiments, the first exponent matrix may be generated by the one or more processors of the first device (e.g., encoder 130 of communication system 105). In some embodiments, the first exponent matrix may be generated by another device (e.g., a device other than the communication system 105) and transmitted to the first device.

The one or more processors may be further configured to shift (or perturbate) one or two values of the first exponent matrix from one or more corresponding positive values of the second exponent matrix by −1 or +1. The one or more corresponding positive values of the second exponent matrix may not be selected as the at least 94 values. In some implementations, the second exponent matrix may include the following set of values: [28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0]. The first exponent matrix (e.g., permutation matrix P) may be generated by perturbating one or two values from the second exponent matrix. For example, based on the second exponent matrix, the first matrix may be generated as [27 96 160 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0] in which the first value 27 and the third value 160 are shifted from 28 and 161, respectively.

In some implementations, the second exponent matrix may include the following set of values: [27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −1 9 −1 146 105 2 −1 −1 0]. For example, based on the second exponent matrix, the first matrix may be generated as [28 96 160 134 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −1 9 −1 146 105 2 −1 −1 0] in which the first value 28 and the fourth value 134 are shifted from 27 and 133, respectively.

In some implementations, the first binary parity check matrix (e.g., H matrix) may be generated using the first exponent matrix (e.g., P). For example, the first binary parity check matrix (e.g., H matrix) may be generated by expanding the exponent matrix P such that each element of the exponent matrix P (as a shift value d) is replaced by a matrix (e.g., Z×Z matrix; Z=162) shifted from an identity matrix (e.g., Z×Z identity matrix; Z=162) by the shift value.

In some implementations, the one or more processors may be further configured to identify a second binary parity check matrix in which one or more columns of the first binary parity check matrix are permuted. The second binary parity check matrix may have the same dimensions as dimensions of the first binary parity check matrix. For example, the second binary parity check matrix may be generated by permuting a first column and a second column of the first binary parity check matrix. The second binary parity check matrix may have the same dimensions as dimensions of the first binary parity check matrix (e.g., m×n; n=3888; m=n(1−5/6)=648). In some implementations, the one or more processors may be further configured to encode data using the second binary parity check matrix.

In some implementations, the one or more processors may be further configured to identify a third binary parity check matrix corresponding to a second exponent matrix in which one or more columns of the first exponent matrix are permuted. The second exponent matrix may have the same dimensions as dimensions of the first exponent matrix (e.g., 4×24; 4 rows and 24 columns). For example, the second exponent matrix may be generated by permuting a first column and a second column of the first exponent. The one or more processors may be configured to encode data using the third binary parity check matrix.

In some implementations, the one or more processors may be further configured to generate the first binary parity check matrix (e.g., H matrix) using (1) a matrix product of the first binary parity check matrix and the first exponent matrix (e.g., H×P), or (2) a matrix product of the first exponent matrix and the first binary parity check matrix (e.g., P×H). For example, the H matrix may be generated by (right) multiplying the matrix product H×P by an inverse matrix of the first exponent matrix (e.g., $P^{-1}$).

In one approach, an apparatus (e.g., the communication system 108) may include a receiver (e.g., receiver circuitry 140) configured to receive encoded data, and one or more processors (e.g., processor 2010). The one or more processors may be configured to identify (e.g., identify/select from a codebook), according to a code rate of 5/6 and a code block size of 3888 bits, a first binary parity check matrix (e.g., parity check matrix H) for a QC-LDPC code. The first binary parity check matrix may correspond to a first exponent matrix (e.g., exponent matrix P=E(H)) having 96 values. In some implementations, before receiving the encoded data, the second device may identify the first binary parity check matrix. In some implementations, in response to receiving the encoded data or after receiving the encoded data, the one or more processors of the second device may identify (e.g., identify/select from a codebook) the first binary parity check matrix. The one or more processors may be configured to decode the received encoded data using the first binary parity check matrix. For example, the encoded data (e.g., codeword c) may be decoded to obtain information bits s by using Equation 1, and Equations 10-13.

In some implementations, the first exponent matrix may include the following set of values: [28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −19 −1 146 105 2 −1 0].

In some implementations, the first exponent matrix may include the following set of values: [27 96 160 133 9 148 15

60 152 105 75 120 –1 98 146 63 149 147 46 –1 2 0 –1 –1
138 126 148 113 128 155 114 130 13 33 103 –1 128 –1 136
18 96 124 109 55 –1 0 0 –1 103 31 1 160 48 51 84 108 89
143 143 18 134 70 –1 117 –1 59 –1 107 0 –1 0 0 33 58 73
83 89 113 119 75 100 49 –1 131 8 131 105 –19 –1 146 105
2 –1 –1 0].

In some implementations, the first exponent matrix may
include at least 94 values selected from a second exponent
matrix having the same dimensions as dimensions of the first
exponent matrix (e.g., 4×24; 4 rows and 24 columns). The
first exponent matrix may include one or two values shifted
(or perturbated) from one or more corresponding positive
values of the second exponent matrix by –1 or +1. The one
or more corresponding positive values of the second expo-
nent matrix may not be selected as the at least 94 values. In
some implementations, the second exponent matrix may
include the following set of values: [28 96 161 134 9 149 15
61 153 105 75 120 –1 98 146 63 149 147 46 –1 2 0 –1 –1
138 127 148 114 128 156 114 130 14 33 103 –1 128 –1 136
18 96 124 109 55 –1 0 0 –1 104 32 1 160 49 52 85 108 90
144 143 18 134 70 –1 117 –1 59 –1 107 0 –1 0 0 33 58 73
83 89 114 119 75 101 49 –1 131 8 131 105 –1 9 –1 146 105
2 –1 –1 0]. The first exponent matrix (e.g., permutation
matrix P) may include one or two values perturbated from
the second exponent matrix. For example, the first matrix
may include the following set of values: [27 96 160 134 9
149 15 61 153 105 75 120 –1 98 146 63 149 147 46 –1 2
0 –1 –1 138 127 148 114 128 156 114 130 14 33 103 –1 128
–1 136 18 96 124 109 55 –1 0 0 –1 104 32 1 160 49 52 85
108 90 144 143 18 134 70 –1 117 –1 59 –1 107 0 –1 0 0 33
58 73 83 89 114 119 75 101 49 –1 131 8 131 105 –1 9 –1
146 105 2 –1 –1 0] in which the first value 27 and the third
value 160 are shifted from 28 and 161, respectively.

In some implementations, the second exponent matrix
may include the following set of values: [27 96 160 133 9
148 15 60 152 105 75 120 –1 98 146 63 149 147 46 –1 2
0 –1 –1 138 126 148 113 128 155 114 130 13 33 103 –1 128
–1 136 18 96 124 109 55 –1 0 0 –1 103 31 1 160 48 51 84
108 89 143 143 18 134 70 –1 117 –1 59 –1 107 0 –1 0 0 33
58 73 83 89 113 119 75 100 49 –1 131 8 131 105 –1 9 –1
146 105 2 –1 –1 0]. The first exponent matrix (e.g.,
permutation matrix P) may include one or two values
perturbated from the second exponent matrix. For example,
the first matrix may include the following set of values: [28
96 160 134 9 148 15 60 152 105 75 120 –1 98 146 63 149
147 46 –1 2 0 –1 –1 138 126 148 113 128 155 114 130 13
33 103 –1 128 –1 136 18 96 124 109 55 –1 0 0 –1 103 31
1 160 48 51 84 108 89 143 143 18 134 70 –1 117 –1 59 –1
107 0 –1 0 0 33 58 73 83 89 113 119 75 100 49 –1 131 8
131 105 –1 9 –1 146 105 2 –1 –1 0] in which the first value
28 and the fourth value 134 are shifted from 27 and 133,
respectively.

In some implementations, the one or more processors may
be configured to identify a second binary parity check matrix
in which one or more columns of the first binary parity check
matrix are permuted. The second binary parity check matrix
may have the same dimensions as dimensions of the first
binary parity check matrix. For example, the second binary
parity check matrix may correspond to a matrix in which a
first column and a second column of the first binary parity
check matrix are permuted. The second binary parity check
matrix may have the same dimensions as dimensions of the
first binary parity check matrix (e.g., m×n; n=3888; m=n
(1–5/6)=648). In some implementations, the one or more
processors may be configured to decode the received
encoded data using the second binary parity check matrix
(e.g., using Equation 1, and Equations 10-13).

In certain scenarios, the parity check matrix H may be
created/calculated/computed/generated/obtained through a
hierarchical lifting process. The hierarchical lifting process
may involve generating smaller matrices by applying cyclic
shifting of varying sizes (such as Z/2, Z/4, etc.). Subse-
quently, these smaller matrices can be selectively grouped
together to form the equivalent matrix H.

FIG. 9 is a flow diagram showing a process 900 for
encoding data and/or decoding data using an LDPC code, in
accordance with an embodiment. In some implementations,
the process 900 is performed by one or more processors
(e.g., encoder 130, or processor 2010) of a first device (e.g.,
communication system 105) or by one or more processors
(e.g., decoder 160, or processor 2010) of a second device
(e.g., communication system 108). In other embodiments,
the process 900 is performed by other entities. In some
implementations, the process 900 includes more, fewer, or
different steps than shown in FIG. 9.

At step 902, the one or more processors of the first device
may identify (e.g., identify/select from a codebook), accord-
ing to a code rate of 5/6 and a code block size of 3888 bits,
a first binary parity check matrix (e.g., parity check matrix
H) for a quasi-cyclic-low-density parity-check (QC-LDPC)
code. The first binary parity check matrix may correspond to
a first exponent matrix (e.g., exponent matrix P=E(H))
having 96 values.

In some implementations, the first exponent matrix may
be generated by selecting at least 94 values from a second
exponent matrix having the same dimensions as dimensions
of the first exponent matrix (e.g., 4×24; 4 rows and 24
columns). In some embodiments, the first exponent matrix
may be generated by the one or more processors of the first
device (e.g., encoder 130 of communication system 105). In
some embodiments, the first exponent matrix may be gen-
erated by another device (e.g., a device other than the
communication system 105) and transmitted to the first
device.

In some implementations, one or two values of the first
exponent matrix may be shifted (or perturbated) from one or
more corresponding positive values of the second exponent
matrix by –1 or +1. The one or more corresponding positive
values of the second exponent matrix may not be selected as
the at least 94 values. In some implementations, the second
exponent matrix may include the following set of values: [28
96 161 134 9 149 15 61 153 105 75 120 –1 98 146 63 149
147 46 –1 2 0 –1 –1 138 127 148 114 128 156 114 130 14
33 103 –1 128 –1 136 18 96 124 109 55 –1 0 0 –1 104 32
1 160 49 52 85 108 90 144 143 18 134 70 –1 117 –1 59 –1
107 0 –1 0 0 33 58 73 83 89 114 119 75 101 49 –1 131 8
131 105 –1 9 –1 146 105 2 –1 –1 0]. The first exponent
matrix (e.g., permutation matrix P) may be generated by
perturbating one or two values from the second exponent
matrix. For example, based on the second exponent matrix,
the first matrix may be generated as [27 96 160 134 9 149
15 61 153 105 75 120 –1 98 146 63 149 147 46 –1 2 0 –1
–1 138 127 148 114 128 156 114 130 14 33 103 –1 128 –1
136 18 96 124 109 55 –1 0 0 –1 104 32 1 160 49 52 85 108
90 144 143 18 134 70 –1 117 –1 59 –1 107 0 –1 0 0 33 58
73 83 89 114 119 75 101 49 –1 131 8 131 105 –1 9 –1 146
105 2 –1 –1 0] in which the first value 27 and the third value
160 are shifted from 28 and 161, respectively.

In some implementations, the second exponent matrix
may include the following set of values: [27 96 160 133 9
148 15 60 152 105 75 120 –1 98 146 63 149 147 46 –1 2
0 –1 –1 138 126 148 113 128 155 114 130 13 33 103 –1 128
–1 136 18 96 124 109 55 –1 0 0 –1 103 31 1 160 48 51 84
108 89 143 143 18 134 70 –1 117 –1 59 –1 107 0 –1 0 0 33

58 73 83 89 113 119 75 100 49 –1 131 8 131 105 –1 9 –1 146 105 2 –1 –1 0]. For example, based on the second exponent matrix, the first matrix may be generated as [28 96 160 134 9 148 15 60 152 105 75 120 –1 98 146 63 149 147 46 –1 2 0 –1 –1 138 126 148 113 128 155 114 130 13 33 103 –1 128 –1 136 18 96 124 109 55 –1 0 0 –1 103 31 1 160 48 51 84 108 89 143 143 18 134 70 –1 117 –1 59 –1 107 0 –1 0 0 33 58 73 83 89 113 119 75 100 49 –1 131 8 131 105 –1 9 –1 146 105 2 –1 –1 0] in which the first value 28 and the fourth value 134 are shifted from 27 and 133, respectively.

In some implementations, the first binary parity check matrix (e.g., H matrix) may be generated using the first exponent matrix (e.g., P). For example, the first binary parity check matrix (e.g., H matrix) may be generated by expanding the exponent matrix P such that each element of the exponent matrix P (as a shift value d) is replaced by a matrix (e.g., Z×Z matrix; Z=162) shifted from an identity matrix (e.g., Z×Z identity matrix; Z=162) by the shift value.

In some implementations, the first binary parity check matrix (e.g., H matrix) may be generated using (1) a matrix product of the first binary parity check matrix and the first exponent matrix (e.g., H×P), or (2) a matrix product of the first exponent matrix and the first binary parity check matrix. In some embodiments, the first binary parity check matrix may be generated by the one or more processors of the first device (e.g., P×H). For example, the H matrix may be generated by (right) multiplying the matrix product H×P by an inverse matrix of the first exponent matrix (e.g., $P^{-1}$).

At step 904, the one or more processors of the first device may encode data using the first binary parity check matrix (e.g., using Equation 10, Equation 11, Equation 12 and Equation 13). In some implementations, a second binary parity check matrix in which one or more columns of the first binary parity check matrix are permuted, may be identified. For example, the second binary parity check matrix may be generated by permuting a first column and a second column of the first binary parity check matrix. The second binary parity check matrix may have the same dimensions as dimensions of the first binary parity check matrix (e.g., m×n; n=3888; m=n(1–5/6)=648). In some implementations, the one or more processors of the first device may encode data using the second binary parity check matrix.

In some implementations, a third binary parity check matrix corresponding to a second exponent matrix in which one or more columns of the first exponent matrix are permuted, may be identified. The second exponent matrix may have the same dimensions as dimensions of the first exponent matrix (e.g., 4×24; 4 rows and 24 columns). For example, the second exponent matrix may be generated by permuting a first column and a second column of the first exponent. In some implementations, the one or more processors of the first device may encode data using the third binary parity check matrix.

At step 906, the one or more processors of the first device may transmit the encoded data. For example, the first device (e.g., the communication system 105) may transmit the encoded data to a second device (e.g., the communication system 108).

At step 908, the one or more processors of the second device (e.g., the decoder 160 of the communication system 108) may identify the first binary parity check matrix. For example, the one or more processors of the second device may identify (e.g., identify/select from a codebook), according to a code rate of 5/6 and a code block size of 3888 bits, the first binary parity check matrix (e.g., parity check matrix H) for the QC-LDPC code. The first binary parity check matrix may correspond to the first exponent matrix (e.g., exponent matrix P=E(H)) having 96 values.

At step 910, the one or more processors of the second device may receive, from the first device, the encoded data. In some implementations, before receiving the encoded data in step 910, the one or more processors of the second device may identify the first binary parity check matrix in step 908. In some implementations, in response to receiving the encoded data or after receiving the encoded data, the one or more processors of the second device may identify (e.g., identify/select from a codebook) the first binary parity check matrix.

In some implementations, the first exponent matrix may include at least 94 values selected from a second exponent matrix having the same dimensions as dimensions of the first exponent matrix (e.g., 4×24; 4 rows and 24 columns). The first exponent matrix may include one or two values shifted (or perturbated) from one or more corresponding positive values of the second exponent matrix by –1 or +1. The one or more corresponding positive values of the second exponent matrix may not be selected as the at least 94 values. In some implementations, the second exponent matrix may include the following set of values: [28 96 161 134 9 149 15 61 153 105 75 120 –1 98 146 63 149 147 46 –1 2 0 –1 –1 138 127 148 114 128 156 114 130 14 33 103 –1 128 –1 136 18 96 124 109 55 –1 0 0 –1 104 32 1 160 49 52 85 108 90 144 143 18 134 70 –1 117 –1 59 –1 107 0 –1 0 0 33 58 73 83 89 114 119 75 101 49 –1 131 8 131 105 –1 9 –1 146 105 2 –1 –1 0]. The first exponent matrix (e.g., permutation matrix P) may include one or two values perturbated from the second exponent matrix. For example, the first matrix may include the following set of values: [27 96 160 134 9 149 15 61 153 105 75 120 –1 98 146 63 149 147 46 –1 2 0 –1 –1 138 127 148 114 128 156 114 130 14 33 103 –1 128 –1 136 18 96 124 109 55 –1 0 0 –1 104 32 1 160 49 52 85 108 90 144 143 18 134 70 –1 117 –1 59 –1 107 0 –1 0 0 33 58 73 83 89 114 119 75 101 49 –1 131 8 131 105 –1 9 –1 146 105 2 –1 –1 0] in which the first value 27 and the third value 160 are shifted from 28 and 161, respectively.

In some implementations, the second exponent matrix may include the following set of values: [27 96 160 133 9 148 15 60 152 105 75 120 –1 98 146 63 149 147 46 –1 2 0 –1 –1 138 126 148 113 128 155 114 130 13 33 103 –1 128 –1 136 18 96 124 109 55 –1 0 0 –1 103 31 1 160 48 51 84 108 89 143 143 18 134 70 –1 117 –1 59 –1 107 0 –1 0 0 33 58 73 83 89 113 119 75 100 49 –1 131 8 131 105 –1 9 –1 146 105 2 –1 –1 0]. The first exponent matrix (e.g., permutation matrix P) may include one or two values perturbated from the second exponent matrix. For example, the first matrix may include the following set of values: [28 96 160 134 9 148 15 60 152 105 75 120 –1 98 146 63 149 147 46 –1 2 0 –1 –1 138 126 148 113 128 155 114 130 13 33 103 –1 128 –1 136 18 96 124 109 55 –1 0 0 –1 103 31 1 160 48 51 84 108 89 143 143 18 134 70 –1 117 –1 59 –1 107 0 –1 0 0 33 58 73 83 89 113 119 75 100 49 –1 131 8 131 105 –1 9 –1 146 105 2 –1 –1 0] in which the first value 28 and the fourth value 134 are shifted from 27 and 133, respectively.

At step 912, the one or more processors of the second device may decode the encoded data using the first binary parity check matrix. For example, the encoded data (e.g., codeword c) may be decoded to obtain information bits s by using Equation 1, and Equations 10-13.

In some implementations, the one or more processors may be configured to identify a second binary parity check matrix in which one or more columns of the first binary parity check matrix are permuted. The second binary parity check matrix may have the same dimensions as dimensions of the first binary parity check matrix. For example, the second binary parity check matrix may correspond to a matrix in which a first column and a second column of the first binary parity check matrix are permuted. The second binary parity check matrix may have the same dimensions as dimensions of the first binary parity check matrix (e.g., m×n; n=3888; m=n (1−5/6)=648). In some implementations, the one or more processors may be configured to decode the received encoded data using the second binary parity check matrix (e.g., using Equation 1, and Equations 10-13).

FIGS. 10A, 10B, 10C, 10D, 10E and 10F are diagrams depicting example simulation results using QC-LDPC codes according to a code rate of 5/6, according to one or more embodiments. The results were obtained with the following simulation settings. Packet error rate (PER) values are averaged over 5000-10000 independent channel realizations with gains reference at PER=1%. One channel instance spans 4 orthogonal frequency-division multiplexing (OFDM) symbols. Channel models includes (1) "DNLOS" indicating a 802.11 MIMO channel model type D which is non-line of sight; (2) "BLOS" indicating a 802.11 channel model Type B which is line of sight; and (3) AWGN indicating a flat channel with additive white gaussian noise. No radio frequency (RF) impairments are included. The payload size is kept the same; and the number of codewords can thus scale inversely with q for block length=1944q. Decoding is performed using a belief propagation (BP) based decoder (e.g., using layered scheduling, with max 20 iterations). MIMO-2×2 channels use a reduced complexity near optimal maximum likelihood detector. SISO (single input single output) 1×1 channels use a linear detector.

Figures 10A, 10B:
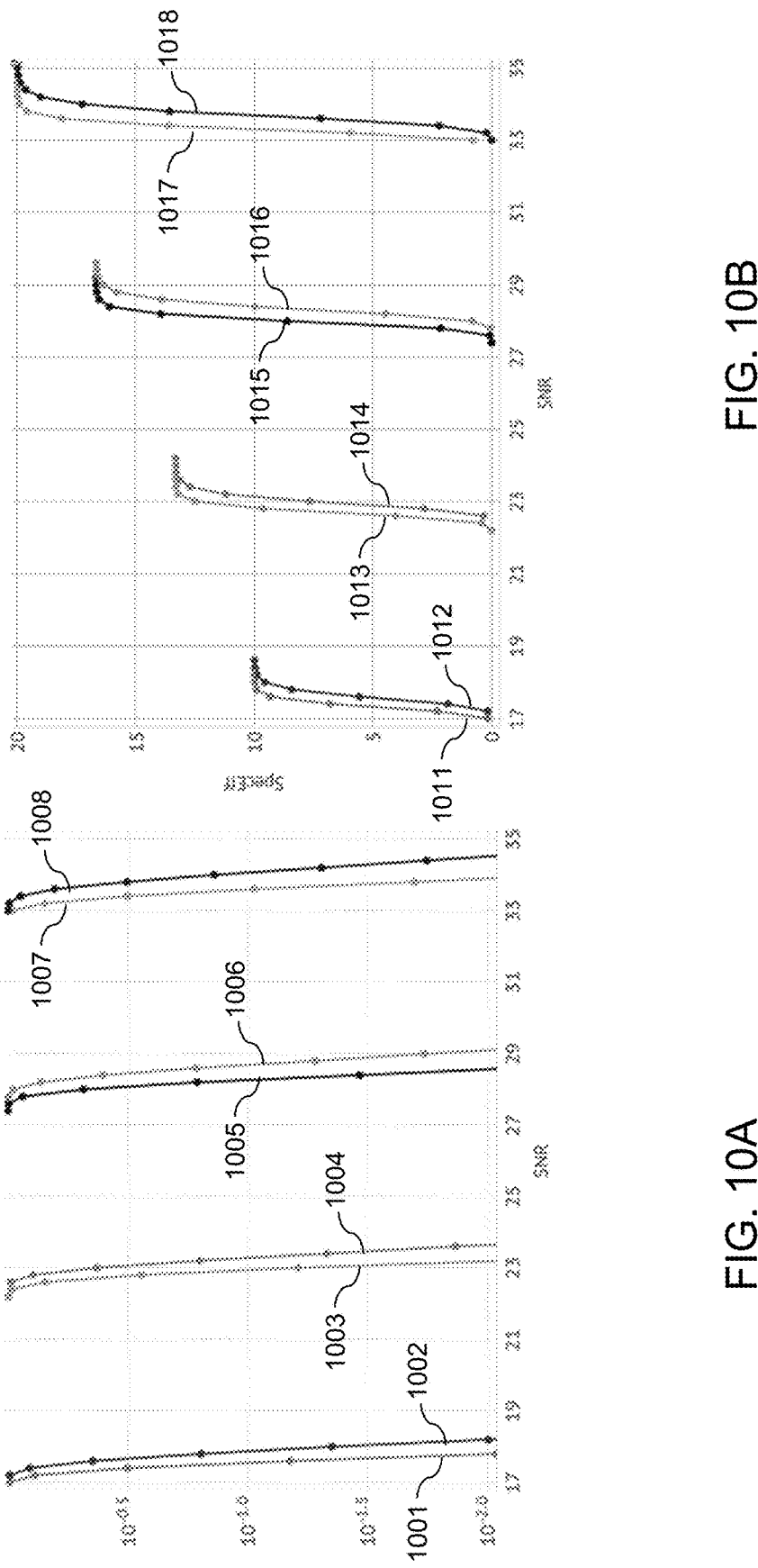
FIGS. 10A, 10B, 10C, 10D, 10E and 10F are diagrams depicting example simulation results using QC-LDPC codes, according to one or more embodiments.
Figures 10C, 10D:
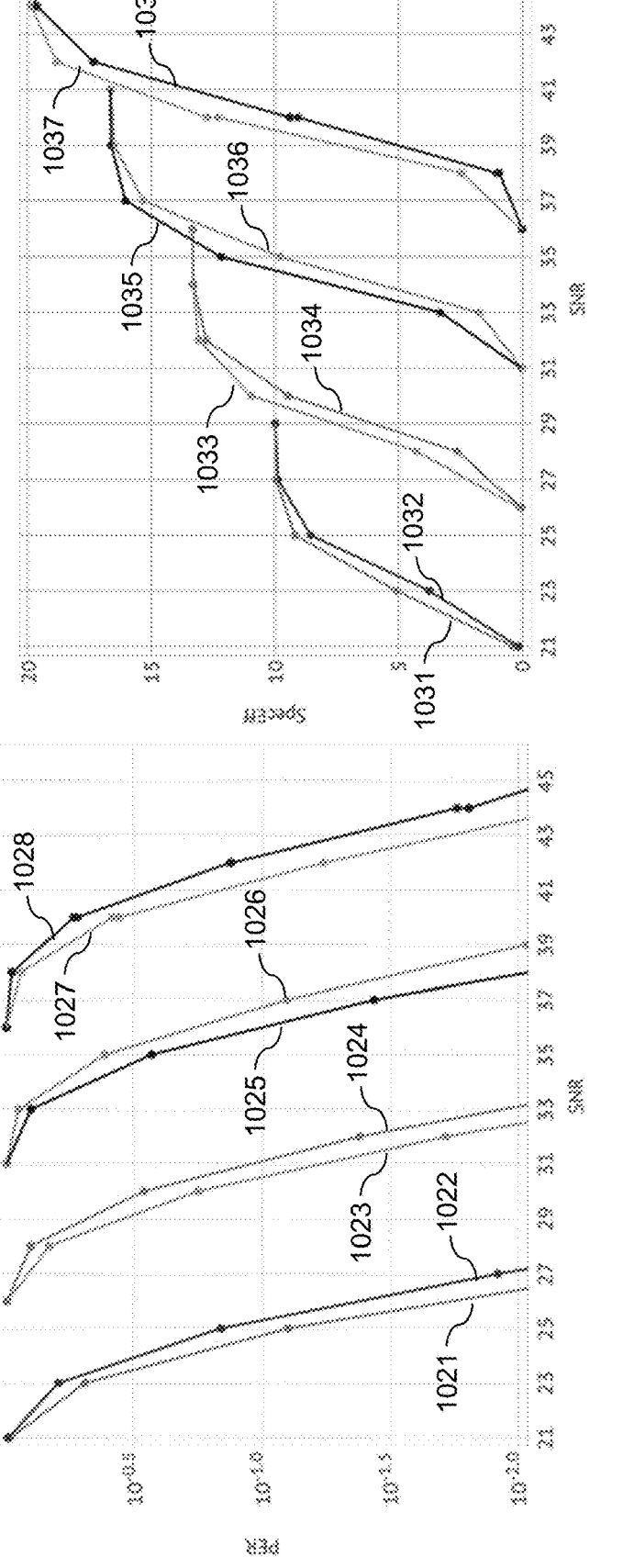
Figures 10E, 10F:
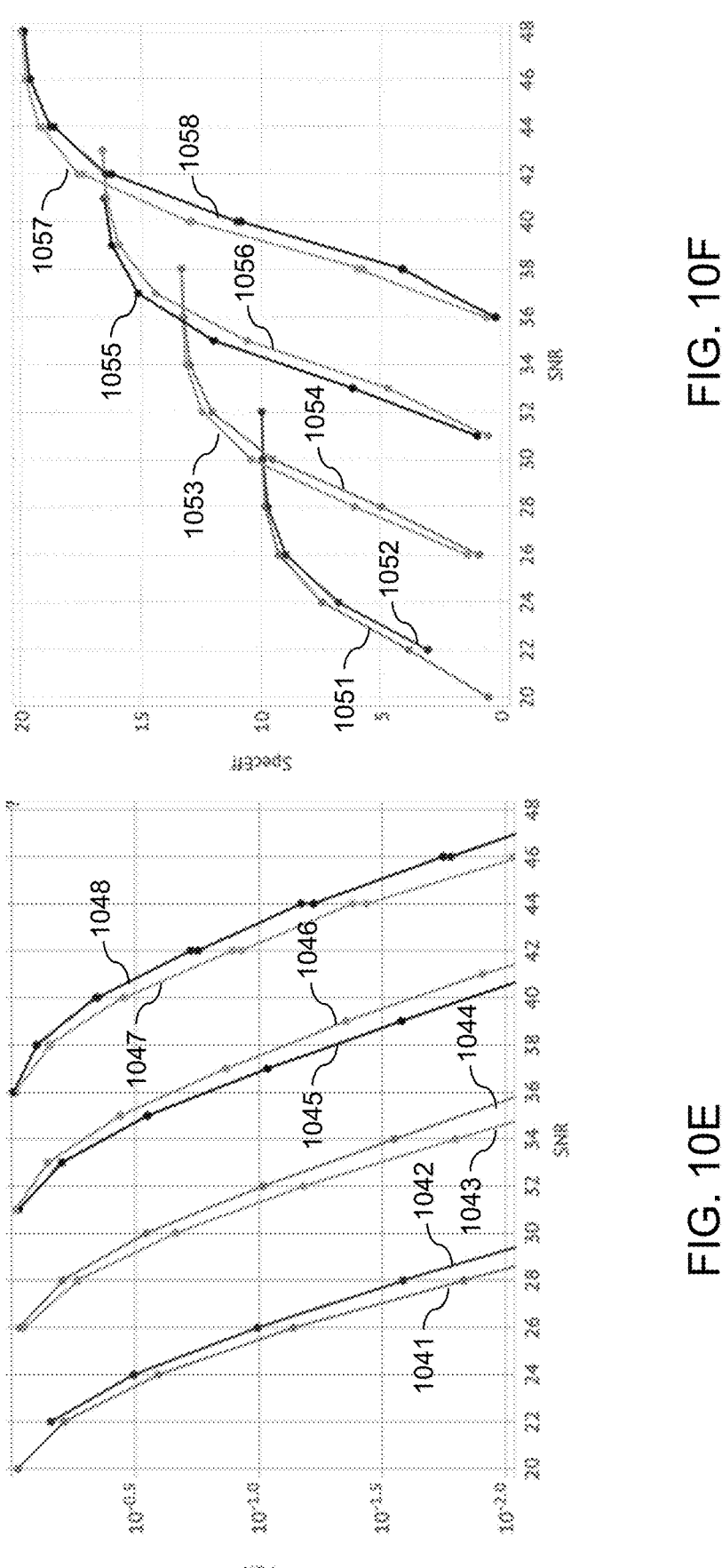

FIGS. 10A, 10C, 10E are diagrams showing PER for different SNRs; and FIGS. 10B, 10D, 10F are spectral efficiency (SpecEff) for different SNRs, respectively. PER refers to the number of error packets divided by the total number of received packets. SpecEff refers to an information rate (or bit rate or effective data rate) over a given bandwidth in a communication system (in the unit of bits/second/Hz). SpecEff may be a normalized rate of transmission such that the actual transmission rate (bits/second)=SpecEff×bandwidth (Hz).

FIGS. 10A and 10B show simulation results with an AWGN, (frequency) flat channel. Referring to FIG. 10A, lines 1001, 1003, 1005, 1007 correspond to simulation results (PER vs SNR) using LDPC codes with block length of 3888 using modulations of 64-QAM, 256-QAM, 1024-QAM, 4096-QAM, respectively; and lines 1002, 1004, 1006, 1008 correspond to simulation results using LDPC with block length of 1944 using modulations of 64-QAM, 256-QAM, 1024-QAM, 4096-QAM, respectively. Referring to FIG. 10B, lines 1011, 1013, 1015, 1017 correspond to simulation results (SpecEff vs SNR) using LDPC codes with block length of 3888 using modulations of 64-QAM, 256-QAM, 1024-QAM, 4096-QAM, respectively; and lines 1012, 1014, 1016, 1018 correspond to simulation results using LDPC codes with block length of 1944 using modulations of 64-QAM, 256-QAM, 1024-QAM, 4096-QAM, respectively.

FIGS. 10C and 10D show simulation results with a 2×2 MIMO channels channel with D-NLOS signal propagation. Referring to FIG. 10C, lines 1021, 1023, 1025, 1027 correspond to simulation results (PER vs SNR) using LDPC codes with block length of 3888 using modulations of 64-QAM, 256-QAM, 1024-QAM, 4096-QAM, respectively; and lines 1022, 1024, 1026, 1028 correspond to simulation results using LDPC with block length of 1944 using modulations of 64-QAM, 256-QAM, 1024-QAM, 4096-QAM, respectively. Referring to FIG. 10D, lines 1031, 1033, 1035, 1037 correspond to simulation results (SpecEff vs SNR) using LDPC codes with block length of 3888 using modulations of 64-QAM, 256-QAM, 1024-QAM, 4096-QAM, respectively; and lines 1032, 1034, 1036, 1038 correspond to simulation results using LDPC codes with block length of 1944 using modulations of 64-QAM, 256-QAM, 1024-QAM, 4096-QAM, respectively.

FIGS. 10E and 10F show simulation results with a 2×2 MIMO channels channel with BLOS signal propagation. Referring to FIG. 10E, lines 1041, 1043, 1045, 1047 correspond to simulation results (PER vs SNR) using LDPC codes with block length of 3888 using modulations of 64-QAM, 256-QAM, 1024-QAM, 4096-QAM, respectively; and lines 1042, 1044, 1046, 1048 correspond to simulation results using LDPC with block length of 1944 using modulations of 64-QAM, 256-QAM, 1024-QAM, 4096-QAM, respectively. Referring to FIG. 10F, lines 1051, 1053, 1055, 1057 correspond to simulation results (SpecEff vs SNR) using LDPC codes with block length of 3888 using modulations of 64-QAM, 256-QAM, 1024-QAM, 4096-QAM, respectively; and lines 1052, 1054, 1056, 1058 correspond to simulation results using LDPC codes with block length of 1944 using modulations of 64-QAM, 256-QAM, 1024-QAM, 4096-QAM, respectively.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with strips, block of data, data rows, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A method for increasing a gain in a signal-to-noise (SNR) of a channel compared with encoding data using a quasi-cyclic-low-density parity-check (QC-LDPC) code corresponding to a code block size smaller than 3888 bits, comprising:

identifying, by baseband circuitry of a first device according to a code rate of 5/6 and a code block size of 3888 bits, a first binary parity check matrix for a QC-LDPC code, the first binary parity check matrix corresponding to a first exponent matrix having 96 values;

encoding, by an encoder of the baseband circuitry of the first device, data using the first binary parity check matrix; and transmitting, by a transmitter of the first device, the encoded data over the channel.

2. The method of claim 1, further comprising:

generating the first exponent matrix by selecting at least 94 values from a second exponent matrix having the same dimensions as dimensions of the first exponent matrix.

3. The method of claim 2, further comprising:

shifting one or two values of the first exponent matrix from one or more corresponding positive values of the second exponent matrix by −1 or +1, wherein the one or more corresponding positive values of the second exponent matrix are not selected as the at least 94 values.

4. The method of claim 2, wherein the second exponent matrix comprises the following set of values:

[28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0].

5. The method of claim 2, wherein the second exponent matrix comprises the following set of values:

[27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −19 −1 146 105 2 −1 −1 0].

6. The method of claim 1, further comprising:

identifying a second binary parity check matrix in which one or more columns of the first binary parity check matrix are permuted, the second binary parity check matrix having the same dimensions as dimensions of the first binary parity check matrix; and encoding, by the encoder, data using the second binary parity check matrix.

7. The method of claim 1, further comprising:

identifying a third binary parity check matrix corresponding to a second exponent matrix in which one or more columns of the first exponent matrix are permuted, the second exponent matrix having the same dimensions as dimensions of the first exponent matrix; and encoding, by the encoder, data using the third binary parity check matrix.

8. The method of claim 1, further comprising:

generating the first binary parity check matrix using (1) a matrix product of the first binary parity check matrix and the first exponent matrix, or (2) a matrix product of the first exponent matrix and the first binary parity check matrix.

9. The method of claim 1, further comprising:

identifying, by a second device, the first binary parity check matrix;

receiving, by the second device from the first device, the encoded data; and decoding, by the second device, the encoded data using the first binary parity check matrix.

10. An apparatus for increasing a gain in a signal-to-noise (SNR) of a channel compared with encoding data using a quasi-cyclic-low-density parity-check (QC-LDPC) code corresponding to a code block size smaller than 3888 bits, the apparatus comprising:

a transmitter and baseband circuitry, wherein the baseband circuitry is configured to:

identify, according to a code rate of 5/6 and a code block size of 3888 bits, a first binary parity check matrix for a QC-LDPC code, the first binary parity check matrix corresponding to a first exponent matrix having 96 values;

encode, by an encoder of the baseband circuitry, data using the first binary parity check matrix; and transmit, by the transmitter, the encoded data over the channel.

11. The apparatus of claim 10, wherein the baseband circuitry further configured to:

generate the first exponent matrix by selecting at least 94 values from a second exponent matrix having the same dimensions as dimensions of the first exponent matrix.

12. The apparatus of claim 11, wherein the baseband circuitry is further configured to:

shift one or two values of the first exponent matrix from one or more corresponding positive values of the second exponent matrix by −1 or +1, wherein the one or more corresponding positive values of the second exponent matrix are not selected as the at least 94 values.

13. The apparatus of claim 11, wherein the second exponent matrix comprises the following set of values:

[28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0].

14. The apparatus of claim 11, wherein the second exponent matrix comprises the following set of values:

[27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −19 −1 146 105 2 −1 −1 0].

15. The apparatus of claim 10, wherein the baseband circuitry is further configured to:

identify a second binary parity check matrix in which one or more columns of the first binary parity check matrix are permuted, the second binary parity check matrix having the same dimensions as dimensions of the first binary parity check matrix; and encode data using the second binary parity check matrix.

16. The apparatus of claim 10, wherein the baseband circuitry is further configured to:

identify a third binary parity check matrix corresponding to a second exponent matrix in which one or more columns of the first exponent matrix are permuted, the second exponent matrix having the same dimensions as dimensions of the first exponent matrix; and encode data using the third binary parity check matrix.

17. The apparatus of claim 10, wherein the baseband circuitry is further configured to:

generate the first binary parity check matrix using (1) a matrix product of the first binary parity check matrix and the first exponent matrix, or (2) a matrix product of the first exponent matrix and the first binary parity check matrix.

18. An apparatus for increasing a gain in a signal-to-noise (SNR) of the channel compared with encoding data using a quasi-cyclic-low-density parity-check (QC-LDPC) code corresponding to a code block size smaller than 3888 bits, the apparatus comprising:

a receiver configured to receive encoded data over the channel, wherein the encoded data is encoded using a first binary parity check matrix for a QC-LDPC code according to a code rate of 5/6 and a code block size of 3888 bits; and baseband circuitry configured to:

identify, according to the code rate of 5/6 and the code block size of 3888 bits, the first binary parity check matrix corresponding to a first exponent matrix having 96 values; and decode the received encoded data using the first binary parity check matrix.

19. The apparatus of claim 18, wherein the first exponent matrix comprises the following set of values:

[28 96 161 134 9 149 15 61 153 105 75 120 −1 98 146 63 149 147 46 −1 2 0 −1 −1 138 127 148 114 128 156 114 130 14 33 103 −1 128 −1 136 18 96 124 109 55 −1 0 0 −1 104 32 1 160 49 52 85 108 90 144 143 18 134 70 −1 117 −1 59 −1 107 0 −1 0 0 33 58 73 83 89 114 119 75 101 49 −1 131 8 131 105 −1 9 −1 146 105 2 −1 −1 0].

20. The apparatus of claim 18, wherein the first exponent matrix comprises the following set of values:

[27 96 160 133 9 148 15 60 152 105 75 120 −1 98 146 63 149 147 46 −1 2 0 −1 −1 138 126 148 113 128 155 114 130 13 33 103 −1 128 −1 136 18 96 124 109 55 −1 0 0 −1 103 31 1 160 48 51 84 108 89 143 143 18 134 70 −1 117 −1 59 −1 107 0 −1 0 0 33 58 73 83 89 113 119 75 100 49 −1 131 8 131 105 −19 −1 146 105 2 −1 −1 0].

* * * * *